US009799670B2

(12) United States Patent
Nishikawa et al.

(10) Patent No.: US 9,799,670 B2
(45) Date of Patent: Oct. 24, 2017

(54) THREE DIMENSIONAL NAND DEVICE CONTAINING DIELECTRIC PILLARS FOR A BURIED SOURCE LINE AND METHOD OF MAKING THEREOF

(71) Applicant: SANDISK TECHNOLOGIES INC., Plano, TX (US)

(72) Inventors: Masatoshi Nishikawa, Yokkaichi (JP); Jin Liu, Milpitas, CA (US); Chun Ge, Milpitas, CA (US); Yanli Zhang, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/017,961

(22) Filed: Feb. 8, 2016

(65) Prior Publication Data
US 2017/0148800 A1 May 25, 2017

Related U.S. Application Data

(60) Provisional application No. 62/258,250, filed on Nov. 20, 2015.

(51) Int. Cl.
*H01L 27/115* (2017.01)
*H01L 29/792* (2006.01)
(Continued)

(52) U.S. Cl.
CPC .... *H01L 27/1157* (2013.01); *H01L 21/28282* (2013.01); *H01L 27/11573* (2013.01); *H01L 27/11582* (2013.01); *H01L 29/7926* (2013.01)

(58) Field of Classification Search
CPC .......... H01L 27/1157; H01L 27/11573; H01L 21/28282; H01L 29/7926
See application file for complete search history.

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| JP | 2015149413 A | 8/2015 |
| WO | WO02/15277 A2 | 2/2002 |

OTHER PUBLICATIONS

Invitation to Pay Additional Fees (PCT Article 17(3)(a) and Rule 40.1 and 40.2(e)) and Communication Relating to the Results of the Partial International Search from the International Searching Authority for International Patent Application No. PCT/US2016/049986, dated Dec. 22, 2016, 8 pages.
(Continued)

*Primary Examiner* — Benjamin Sandvik
*Assistant Examiner* — Gustavo Ramallo
(74) *Attorney, Agent, or Firm* — The Marbury Law Group PLLC

(57) ABSTRACT

A three-dimensional memory device includes an alternating stack of electrically conductive layers and insulating layers located over a substrate, an array of memory stack structures, each memory stack structure extending through the alternating stack and including a memory film and a semiconductor channel laterally surrounded by the memory film, and an array of dielectric pillars located between the alternating stack and the substrate.

25 Claims, 26 Drawing Sheets

(51) Int. Cl.
  *H01L 21/28* (2006.01)
  *H01L 27/1157* (2017.01)
  *H01L 27/11582* (2017.01)
  *H01L 27/11573* (2017.01)

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 * | 4/2010 | Arai | H01L 27/105 257/315 |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 * | 8/2011 | Fukuzumi | G11C 5/02 257/326 |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0098049 A1 | 4/2012 | Moon et al. | |
| 2012/0119287 A1 | 5/2012 | Park et al. | |
| 2012/0199897 A1 | 8/2012 | Chang et al. | |
| 2013/0168757 A1 * | 7/2013 | Hong | H01L 27/11582 257/324 |
| 2013/0248974 A1 | 9/2013 | Alsmeier et al. | |
| 2013/0264631 A1 | 10/2013 | Alsmeier et al. | |
| 2015/0149413 A1 | 5/2015 | Lee et al. | |
| 2015/0162342 A1 | 6/2015 | Lee et al. | |
| 2015/0179660 A1 | 6/2015 | Yada et al. | |

OTHER PUBLICATIONS

International Search Report and Written Opinion of the International Searching Authority for International Patent Application No. PCT/US2016/049986, dated Feb. 17, 2017, 16 pages.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, M. "3D Cells Make Terabit NAND Flash Possible," Nikkei Electronics Asia, Sep. 17, 2009, 6pgs.
U.S. Appl. No. 14/317,274, filed Jun. 27, 2014, SanDisk Technologies Inc.
U.S. Appl. No. 14/725,466, filed May 29, 2015, SanDisk Technologies Inc.
Invitation to Pay Additional Fees (PCT Article 17(3)(a) and Rule 40.1 and 40.2(e)) and Communication Relating to the Results of the Partial International Search from the International Searching Authority for International Patent Application No. PCT/US2016/062528, dated Feb. 3, 2017, 8 pages.
U.S. "Non-Final" Office Action for U.S. Appl. No. 15/225,492, dated May 5, 2017, 26 pages.
International Search Report and Written Opinion of the International Searching Authority for International Patent Application No. PCT/US2016/0625286, dated Mar. 28, 2017, 18 pages.

* cited by examiner

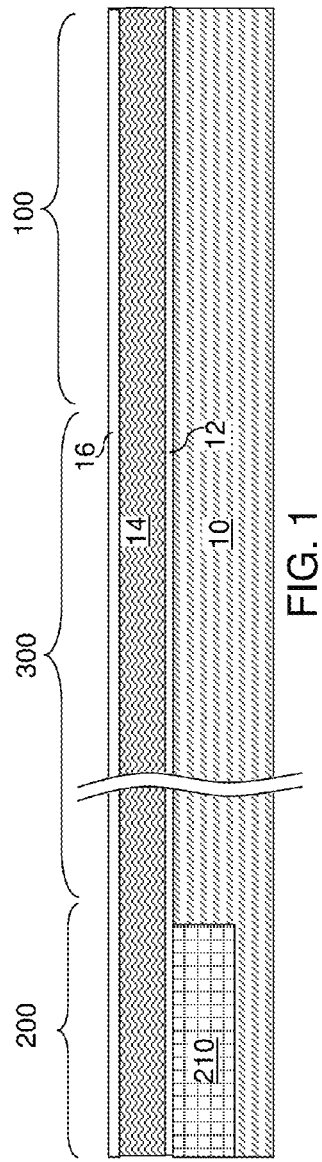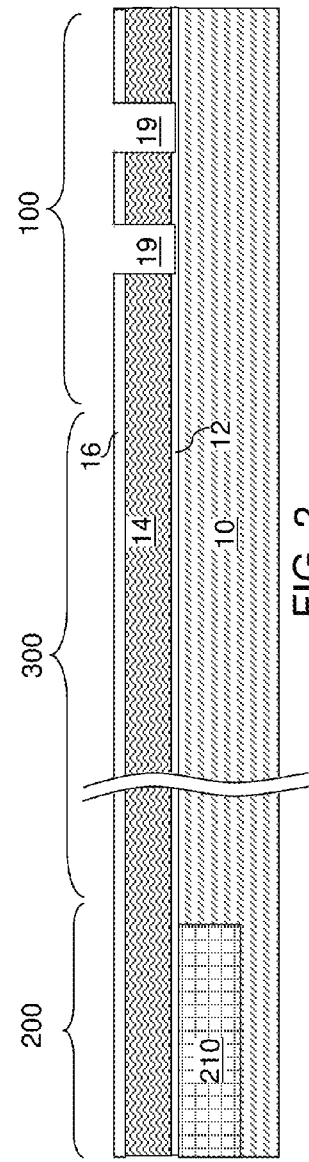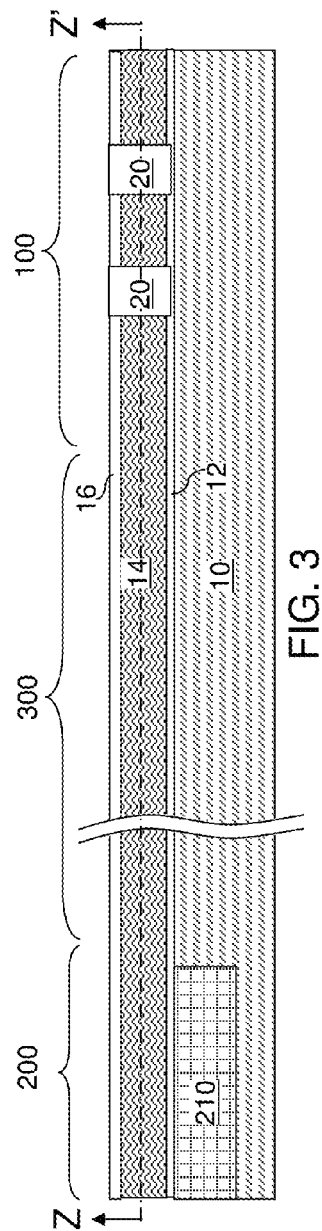

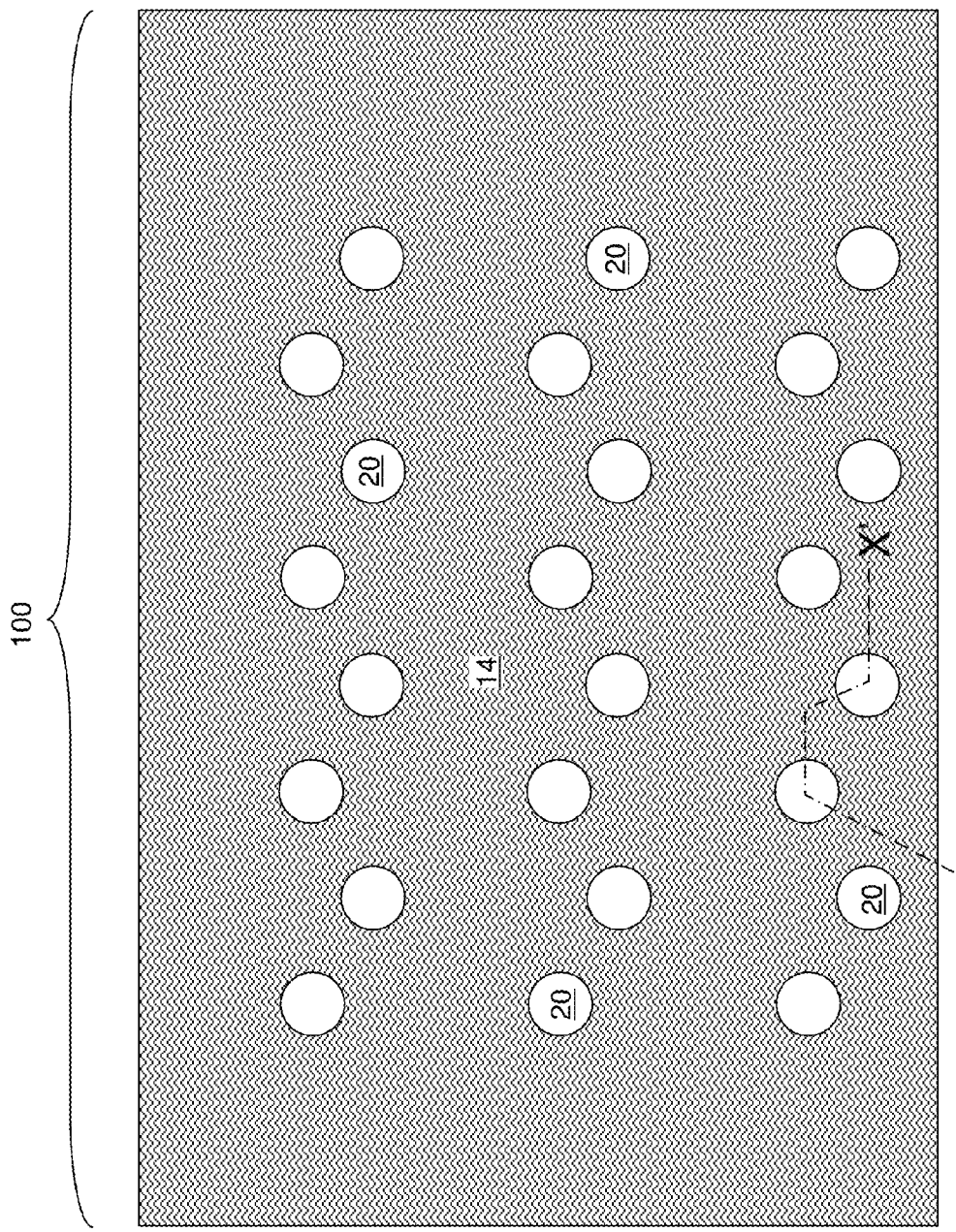

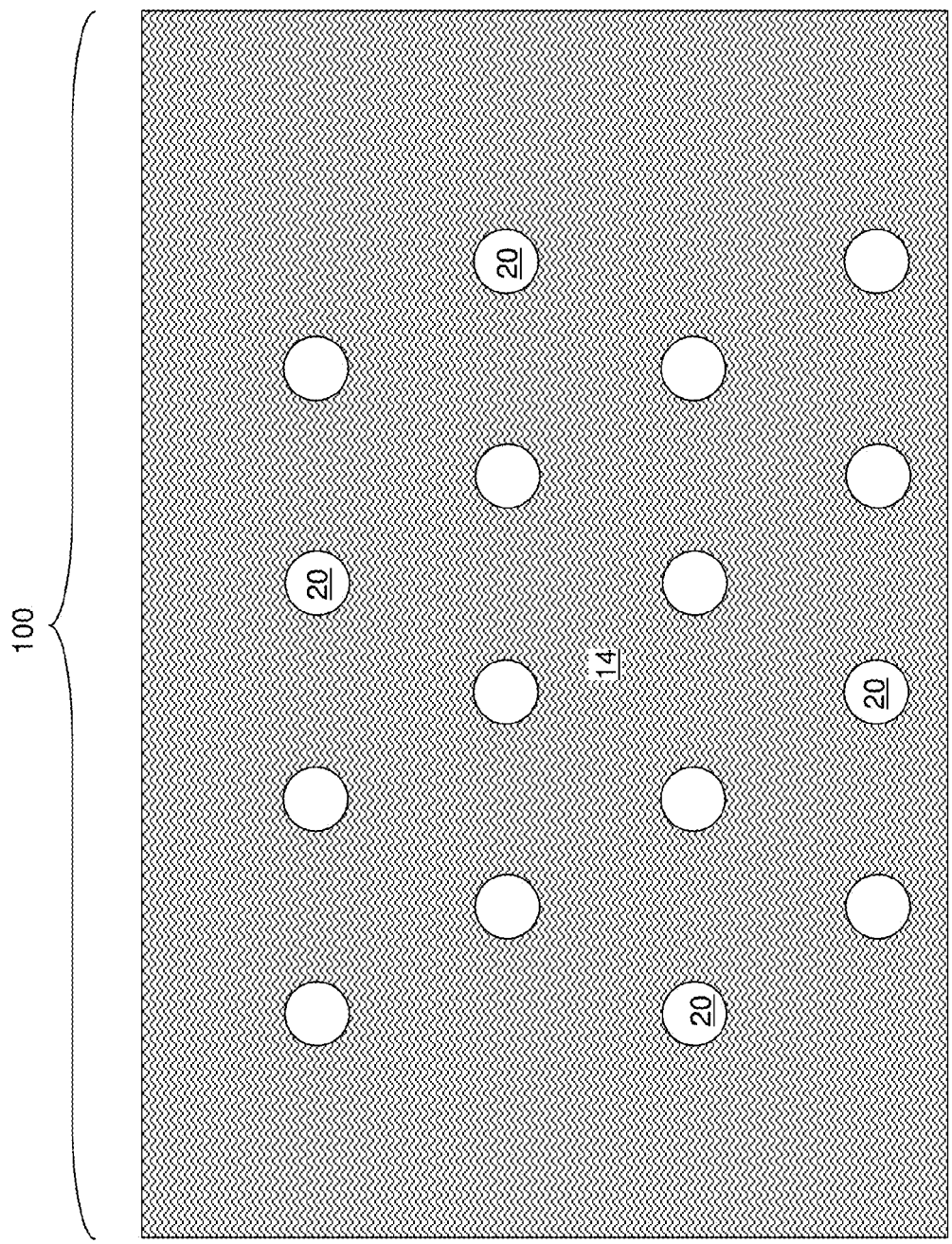

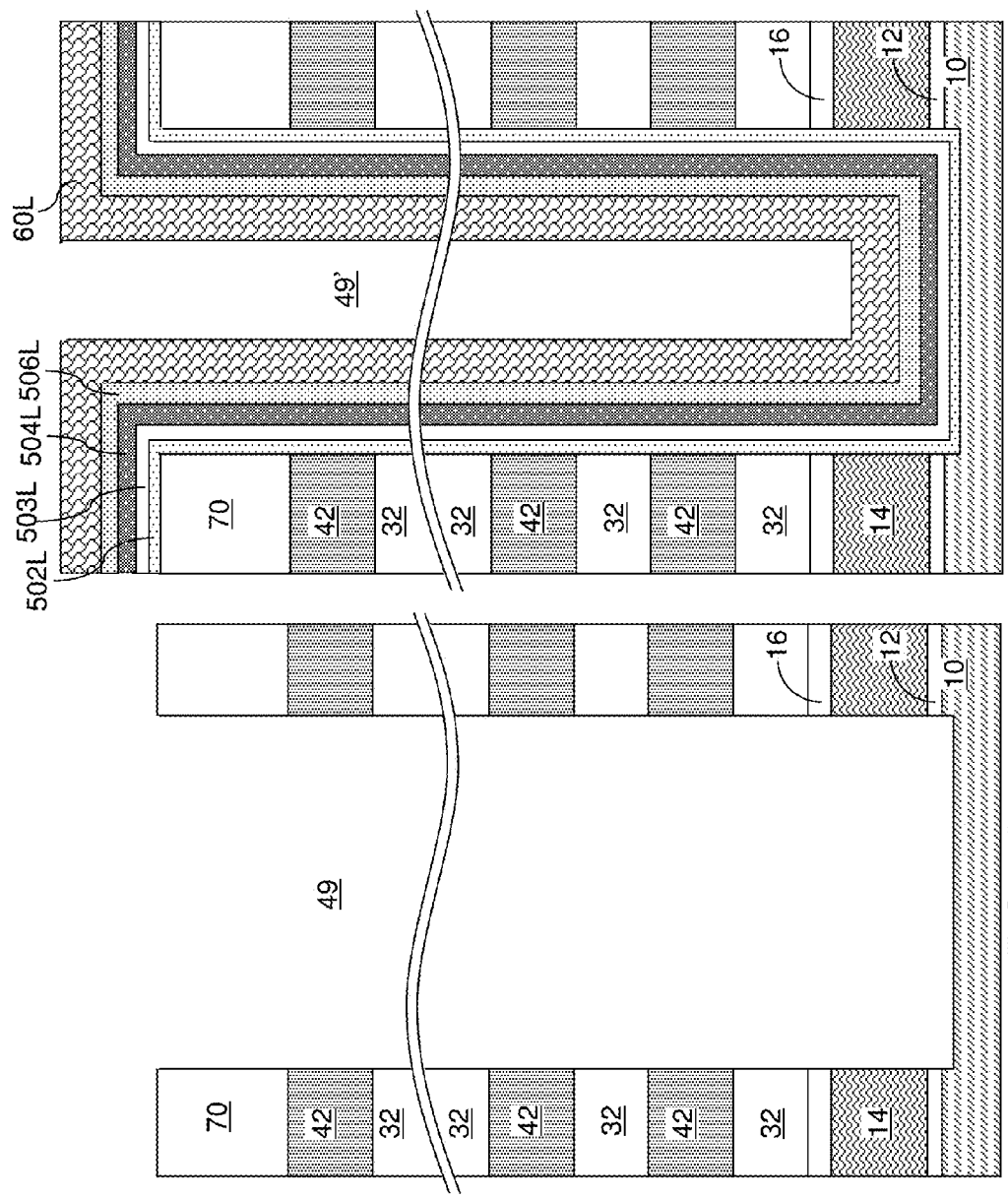

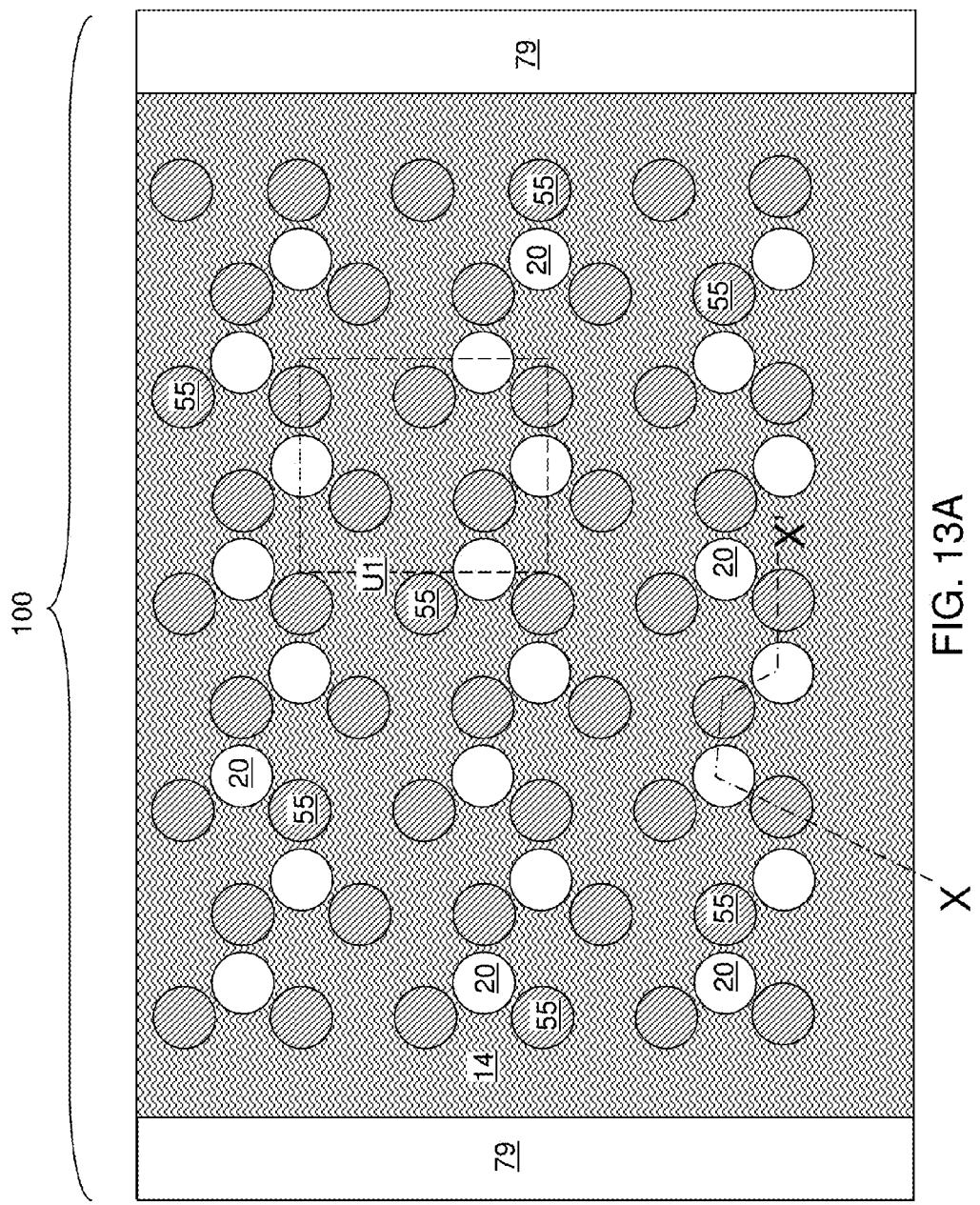

US 9,799,670 B2

THREE DIMENSIONAL NAND DEVICE CONTAINING DIELECTRIC PILLARS FOR A BURIED SOURCE LINE AND METHOD OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of electrically conductive layers and insulating layers located over a substrate; an array of memory stack structures, each memory stack structure extending through the alternating stack and including a memory film and a semiconductor channel laterally surrounded by the memory film; and an array of dielectric pillars located between the alternating stack and the substrate.

According to another aspect of the present disclosure, a method of manufacturing a three-dimensional memory device is provided. A sacrificial matrix layer is formed over a substrate. The sacrificial matrix layer is patterned to form an array of cavities. An array of dielectric pillars is formed by filling the array of cavities with a dielectric fill material. An alternating stack of insulator layers and spacer material layers is formed over the array of dielectric pillars and the sacrificial matrix layer. An array of memory stack structures is formed through the alternating stack and the sacrificial matrix layer. The sacrificial matrix layer is replaced with a source conductive layer.

BRIEF DESCRIPTION OF THE DRAWINGS

FIG. 1 is a vertical cross-sectional view of an exemplary structure after formation of a lower source insulator layer, a sacrificial matrix layer, and an upper source insulator layer according to an embodiment of the present disclosure.

FIG. 2 is a vertical cross-sectional view of the exemplary structure after formation of an array of via cavities through the sacrificial matrix layer according to an embodiment of the present disclosure.

FIG. 3 is a vertical cross-sectional view of the exemplary structure after formation of an array of dielectric pillars according to an embodiment of the present disclosure.

FIG. 4A-4C are horizontal cross-sectional views of the exemplary structure of FIG. 3 through the sacrificial material layer and the array of dielectric pillars for first, second, and third exemplary configurations, respectively, according to an embodiment of the present disclosure. The zigzag vertical planes X-X' correspond to the plane of the vertical cross-sectional view of FIG. 3.

FIGS. 8A-8D are sequential vertical cross-sectional views of a memory opening within the exemplary structure during various processing steps employed to form a memory stack structure according to an embodiment of the present disclosure.

FIGS. 13A-13C are horizontal cross-sectional views of the exemplary structure of FIG. 12A through the sacrificial material layer, the array of dielectric pillars, and the array of memory openings for the first, second, and third exemplary configurations, respectively, according to an embodiment of the present disclosure. The zigzag vertical planes X-X' correspond to the plane of the vertical cross-sectional view of FIG. 12A.

DETAILED DESCRIPTION

Figure 4B:
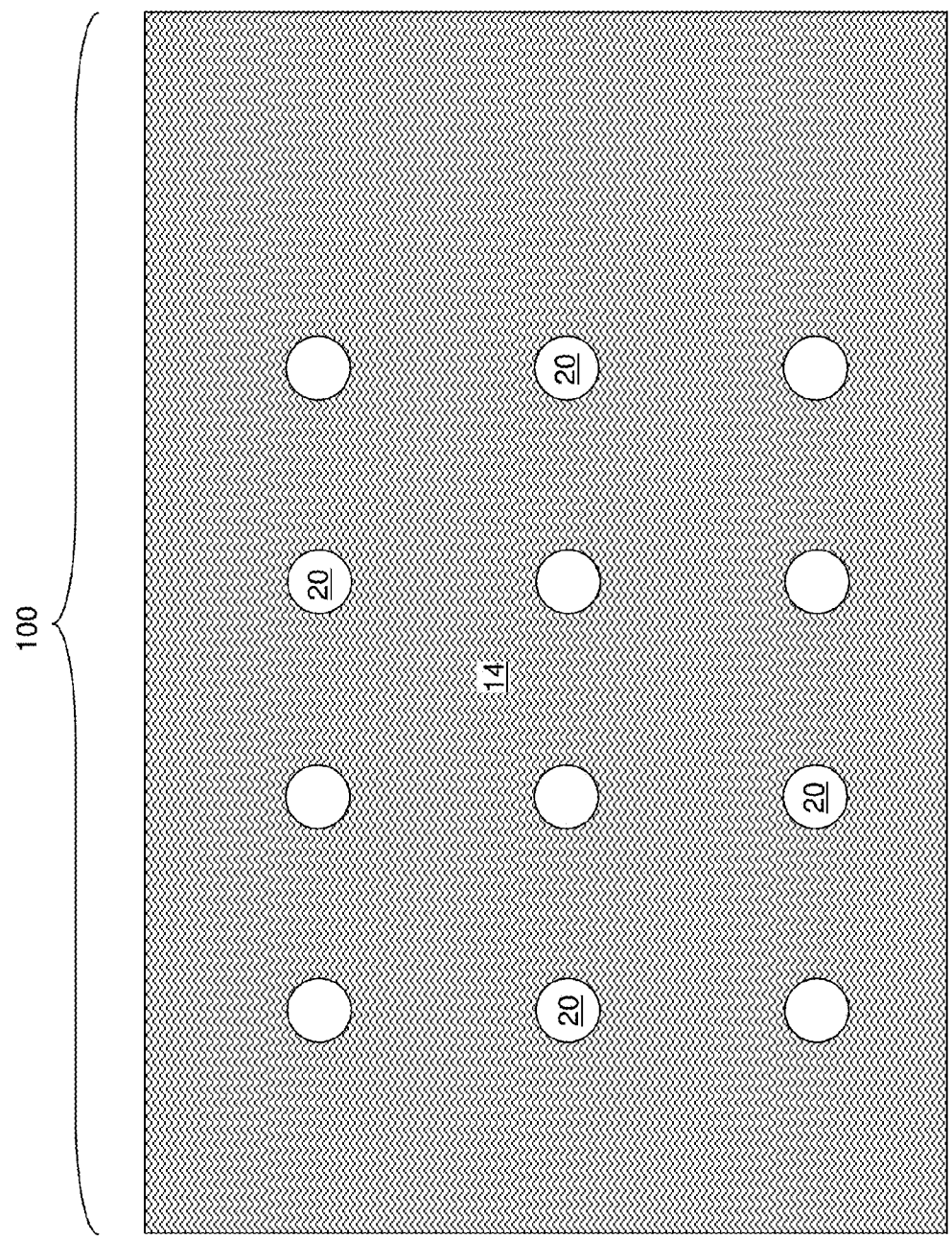

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (e.g., a semiconductor substrate, such as a single crystalline silicon wafer). The substrate can include a substrate semiconductor layer 10. The substrate semiconductor layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the substrate semiconductor layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the substrate semiconductor layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

A lower source insulating layer 12 can be formed above the substrate semiconductor layer 10. The lower source insulating layer 12 provides electrical isolation of a continuous source structure to be subsequently formed from the substrate semiconductor layer 10. The lower source insulating layer 12 can include, for example, silicon oxide and/or a dielectric metal oxide (such as $HfO_2$, $ZrO_2$, $LaO_2$, etc.). The thickness of the lower source insulating layer 12 can be in a range from 3 nm to 30 nm, although lesser and greater thicknesses can also be employed.

A sacrificial matrix layer 14 can be formed over the lower source insulating layer 14. The sacrificial matrix layer 14 includes a material that can be removed selective to the material of the lower source insulating layer 12, and selective to the materials of an upper source insulating layer and an insulating spacer to be subsequently formed. For example, the sacrificial matrix layer 14 can include a semiconductor material such as polysilicon or a silicon-germanium alloy, or can include amorphous carbon, an organic polymer, or an inorganic polymer. The sacrificial matrix layer 14 can be deposited by chemical vapor deposition, physical vapor deposition, or spin coating. The thickness of the sacrificial matrix layer 14 can be in a range from 10 nm to 60 nm, although lesser and greater thicknesses can also be employed.

An optional upper source insulating layer 16 can be formed above the sacrificial matrix layer 14. The upper source insulating layer 16 provides electrical isolation of the continuous source structure to be subsequently formed from electrically conductive layers to be subsequently formed. The upper source insulating layer 16 can include, for example, silicon oxide and/or a dielectric metal oxide (such as $HfO_2$, $ZrO_2$, $LaO_2$, etc.). The thickness of the upper source insulating layer 16 can be in a range from 3 nm to 30 nm, although lesser and greater thicknesses can also be employed. If a subsequent alternating stack to be formed over the upper source insulating layer 16 starts with a sacrificial material layer, the upper source insulating layer 16 is preferably included. If a subsequent alternating stack to be formed over the upper source insulating layer 16 starts with an insulating layer, the upper source insulating layer 16 is optional, and the first insulating material of the alternating stack can function as, i.e., can be identified as, an upper source insulating layer 16. While the present disclosure is described employing an embodiment in which the upper source insulating layer 16 is a distinct from a bottommost insulating layer of an alternating stack to be subsequently formed, embodiments are expressly contemplated in which the upper source insulating layer 16 is the same as the bottommost insulating layer.

Referring to FIG. 2, a photoresist layer (not shown) can be applied over the upper source insulating layer 16 and can be lithographically patterned to form an array of opening therein. The pattern of the array of openings in the photoresist layer can be transferred through the upper source insulating layer 16 and the sacrificial matrix layer 14 by an anisotropic etch such as a reactive ion etch. The lower source insulating layer 12 can be employed as an etch stop layer. If desired, the etch may be continued through the lower source insulating layer 12 to or into the top surface of the substrate semiconductor layer 10. An array of via cavities 19 can be formed in the sacrificial matrix layer 14. The cavities 19 may extend to the lower source insulating layer 12, through the lower source insulating layer 12 to the top surface of the substrate semiconductor layer 10 or into the substrate semiconductor layer 10. The array of via cavities 19 may have a periodic pattern. In one embodiment, each via cavity 19 can have substantially vertical sidewalls and/or can have a substantially circular horizontal cross-sectional shape. In one embodiment, each via cavity 19 can have a substantially cylindrical shape. In one embodiment, the array of via cavities 19 can be a two-dimensional periodic array of instances of a unit cell structure. The photoresist layer can be subsequently removed, for example, by ashing.

Referring to FIG. 3, a dielectric fill material is deposited in the array of via cavities 19, for example, by chemical vapor deposition or spin coating. The dielectric fill material can include, for example, silicon oxide (such as doped silicate glass or undoped silicate glass), a dielectric metal oxide, silicon nitride, organosilicate glass, or a combination thereof. For example, the dielectric fill material can include silicon oxide. Excess portions of the deposited dielectric fill material can be removed from above the horizontal plane including the top surface of the upper source insulating layer 16 by a planarization process, which can employ a recess etch and/or chemical mechanical planarization.

The remaining portions of the dielectric fill material that fill the via cavities 19 constitute an array of dielectric pillars 20. The array of dielectric pillars 20 may have a periodic pattern. In one embodiment, each dielectric pillar 20 can have substantially vertical sidewalls and/or can have a substantially circular horizontal cross-sectional shape. In one embodiment, each dielectric pillar 20 can have a substantially cylindrical shape. In one embodiment, the array of dielectric pillars 20 can be a two-dimensional periodic array of instances of a unit cell structure. The top surfaces of the dielectric pillars 20 and the top surface of the upper source insulating layer 16 can be coplanar, i.e., can be located within a same Euclidean plane.

FIGS. 4A-4C illustrate various exemplary patterns that can be employed for the array of dielectric pillars 20. Specifically, FIGS. 4A-4C illustrate the array of dielectric pillars 20 for first, second, and third exemplary configurations, respectively. The pattern illustrated in FIG. 4A is herein referred to as a zigzag pattern, the pattern illustrated in FIG. 4B is herein referred to as a lattice pattern, and the pattern illustrated in FIG. 4C is herein referred to as a diagonal pattern. The zigzag pattern may comprise zigzag rows (i.e., saw tooth shaped rows) of dielectric pillars 20. The rows may extend parallel to the word line direction or parallel to the bit line direction. The lattice pattern may comprise a plurality of linear rows and columns of pillars 20 which form rectangular or square unit cells of pillars 20. The diagonal pattern may comprise a plurality of parallel diagonal rows of pillars 20 which extend at an angle of 30 to 60 degrees, such as about 45 degrees, with respect to the bit line and word line directions. The rows form parallelogram shaped unit cells which lack a right angle. The periodicity of each pattern may be selected to be commensurate with the pattern of memory openings to be subsequently formed. In one embodiment, the periodicity of each pattern of the dielectric pillars 20 can be the same as, or can be an integer multiple of, the periodicity of the memory openings to be subsequently formed along the same direction.

Figure 5:
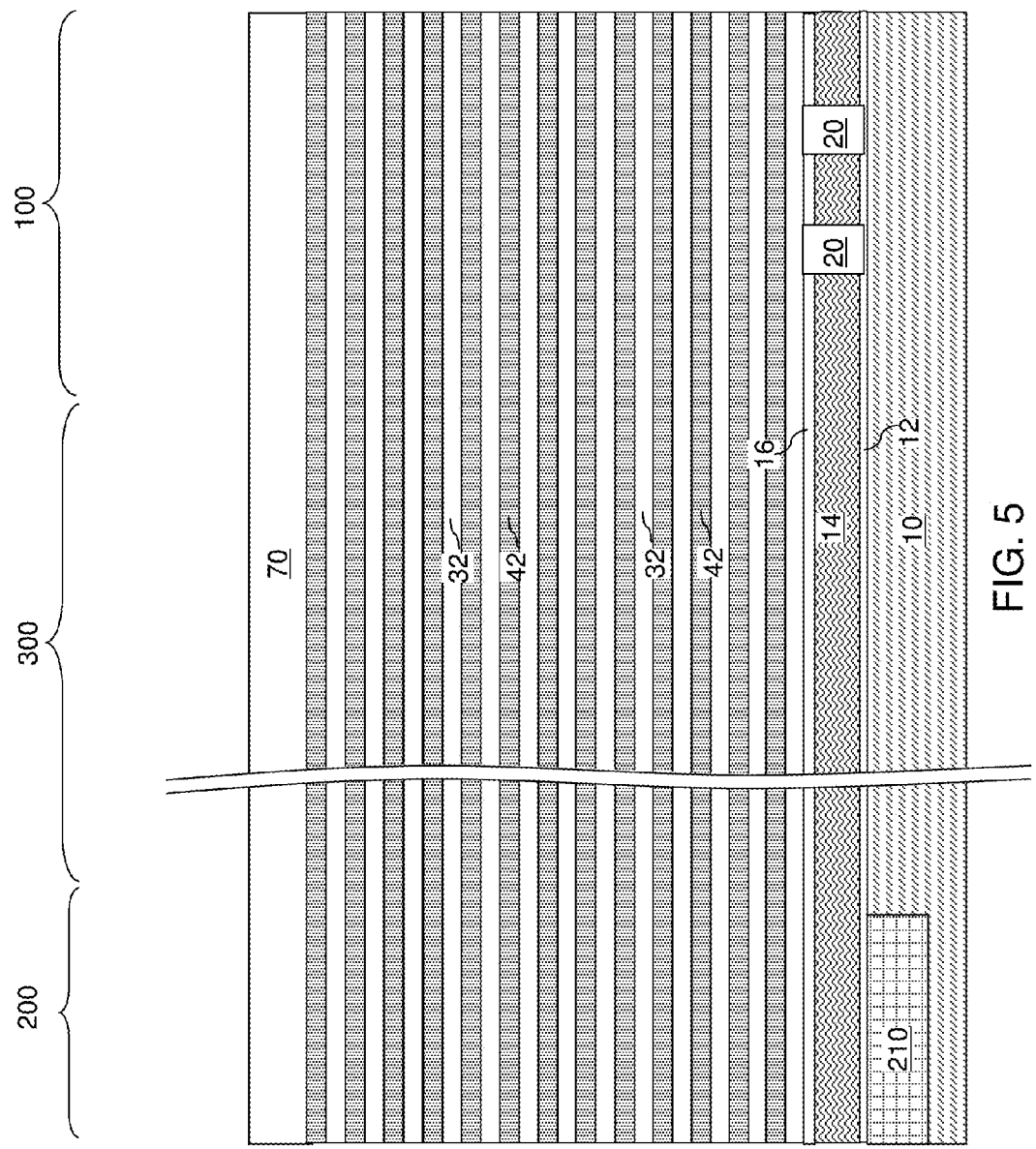
FIG. 5 is a vertical cross-sectional view of the exemplary structure after formation of an alternating stack of insulating layers and sacrificial material layers according to an embodiment of the present disclosure.

Referring to FIG. 5, an alternating stack of first material layers (which can be insulating layers 32) and second material layers (which are referred to spacer material layers) is formed over the upper source insulating layer 16. As used herein, a "material layer" refers to a layer including a material throughout the entirety thereof. In one embodiment, the alternating stack may include the insulating layers 32 and spacer material layers that are located between each vertically neighboring pair of insulating layers 32. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer (i.e., the spacer material layers) can be a sacrificial material layer 42. In this case, the stack can include an alternating plurality of insulating layers 32 and sacrificial material layers 42, and constitutes an in-process alternating stack comprising insulating layers 32 and sacrificial material layers 42. As used herein, an "alternating stack" of first elements and second elements is a structure in which instances of a first element and instances of a second element alternate along a same direction, such as a vertical direction. As used herein, a "prototype" structure or an "in-process" structure refers to a transient structure that is subsequently modified in the shape or composition of at least one component therein. Thus, the in-process alternating stack (32, 42) can be formed over the layer stack of the lower source insulator layer 12, the sacrificial matrix layer 14, and the upper source insulator layer 16.

In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In an illustrative example, the insulating layers 32 can include silicon oxide, and sacrificial material layers can include silicon nitride. As used herein, silicon nitride, or a silicon nitride material, refers to a dielectric compound of at least one Group IV element and at least one non-metallic element such that silicon accounts more than 50 atomic percent of the at least one Group IV element and nitrogen accounts for more than 50 atomic percent of the non-metallic element. As such, silicon nitrides include $Si_3N_4$ and a silicon oxynitride in which the atomic concentration of nitrogen is greater than the atomic concentration of oxygen. As used herein, silicon oxide, or a silicon oxide material, refers to a dielectric compound of at least one Group IV element and at least one non-metallic element such that silicon accounts more than 50 atomic percent of the at least one Group IV element and oxygen accounts for more than 50 atomic percent of the non-metallic element. Silicon oxides include silicon dioxide, an oxide of a silicon-germanium alloy in which the atomic concentration of silicon is greater than the atomic concentration of germanium, a silicon oxynitride in which the atomic concentration of oxygen is greater than the atomic concentration of nitrogen, and doped derivatives thereof (such as phosphosilicate glass, fluorosilicate glass, borophosphosilicate glass, organosilicate glass, etc.). The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6:
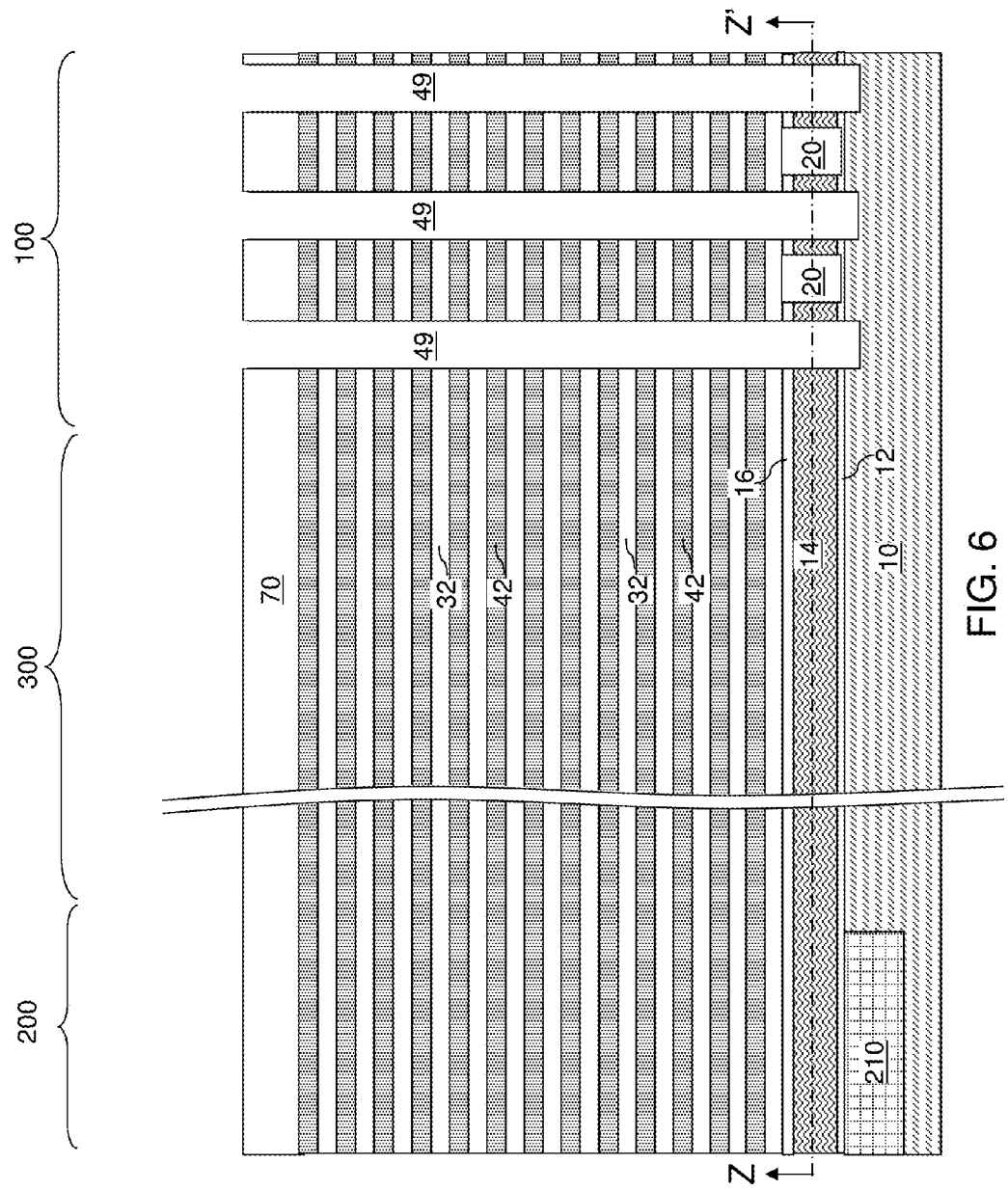
FIG. 6 is a vertical cross-sectional view of the exemplary structure after formation of memory openings extending through the alternating stack according to an embodiment of the present disclosure.

Referring to FIG. 6, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the optional insulating cap layer 70, through entirety of the alternating stack (32, 42), and through the upper source insulating layer 16, the sacrificial matrix layer 14, and the lower source insulating layer 12 by at least one anisotropic etch that employs the patterned lithographic material stack as an etch mask. Portions of the insulating cap layer 70, the alternating stack (32, 42), the upper source insulating layer 16, the sacrificial matrix layer 14, and the lower source insulating layer 12 underlying the openings in the patterned lithographic material stack are etched to form memory openings 49. In other words, the transfer of the pattern in the patterned lithographic material stack through the optional insulating cap layer 70, through entirety of the alternating stack (32, 42), and through the upper source insulating layer 16, the sacrificial matrix layer 14, and the lower source insulating layer 12 and optionally partially through the substrate semiconductor layer 10 forms the memory openings 49. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the lower source insulating layer 12 may be used as an etch stop layer. The sidewalls of the memory openings 49 can be substantially vertical, or can be tapered. The patterned lithographic material stack can be subsequently removed, for example, by ashing.

Figure 7A:
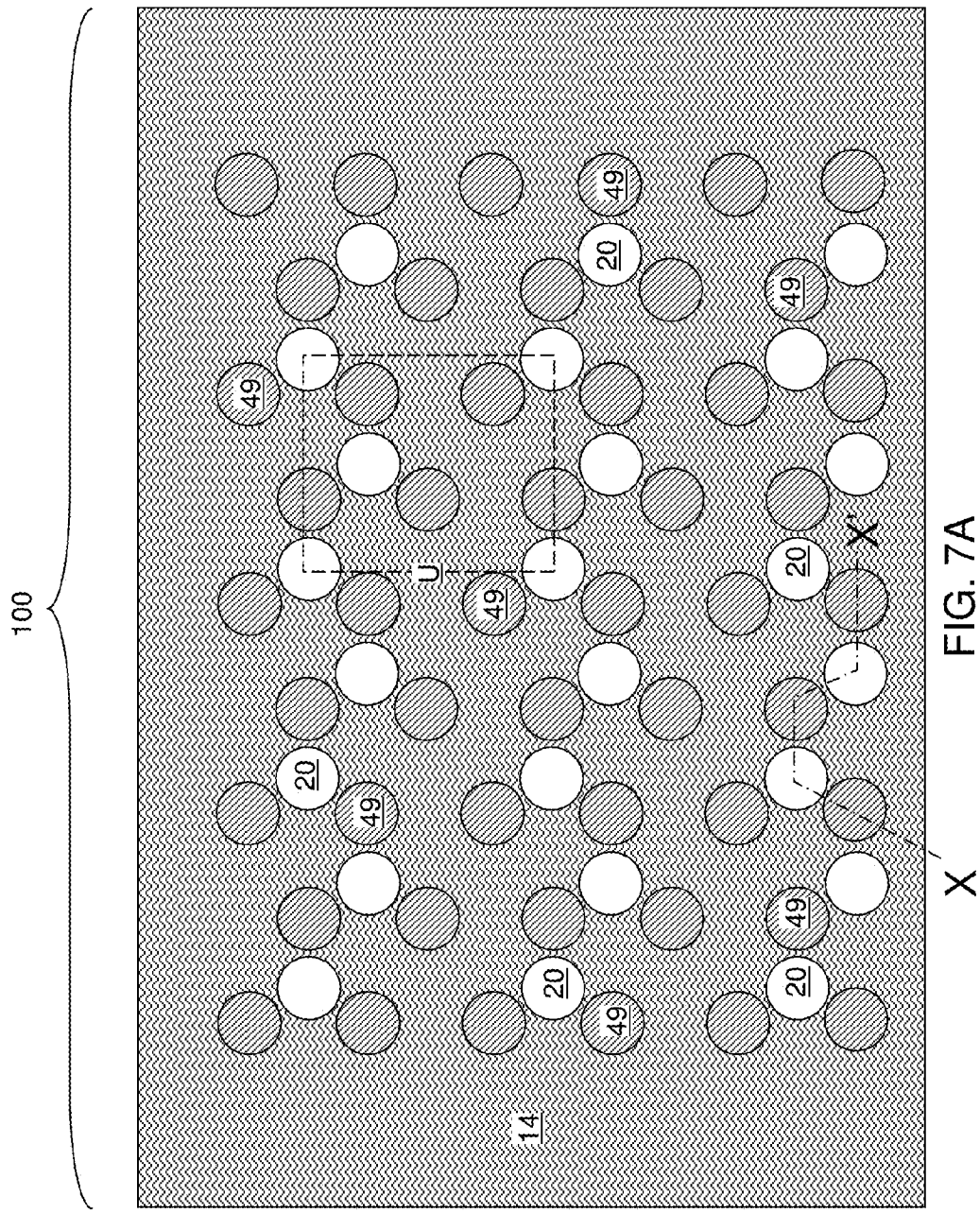
FIG. 7A-7C are horizontal cross-sectional views of the exemplary structure of FIG. 6 through the sacrificial material layer, the array of dielectric pillars, and the array of memory openings for the first, second, and third exemplary configurations, respectively, according to an embodiment of the present disclosure. The zigzag vertical planes X-X' correspond to the plane of the vertical cross-sectional view of FIG. 6.
Figure 7B:
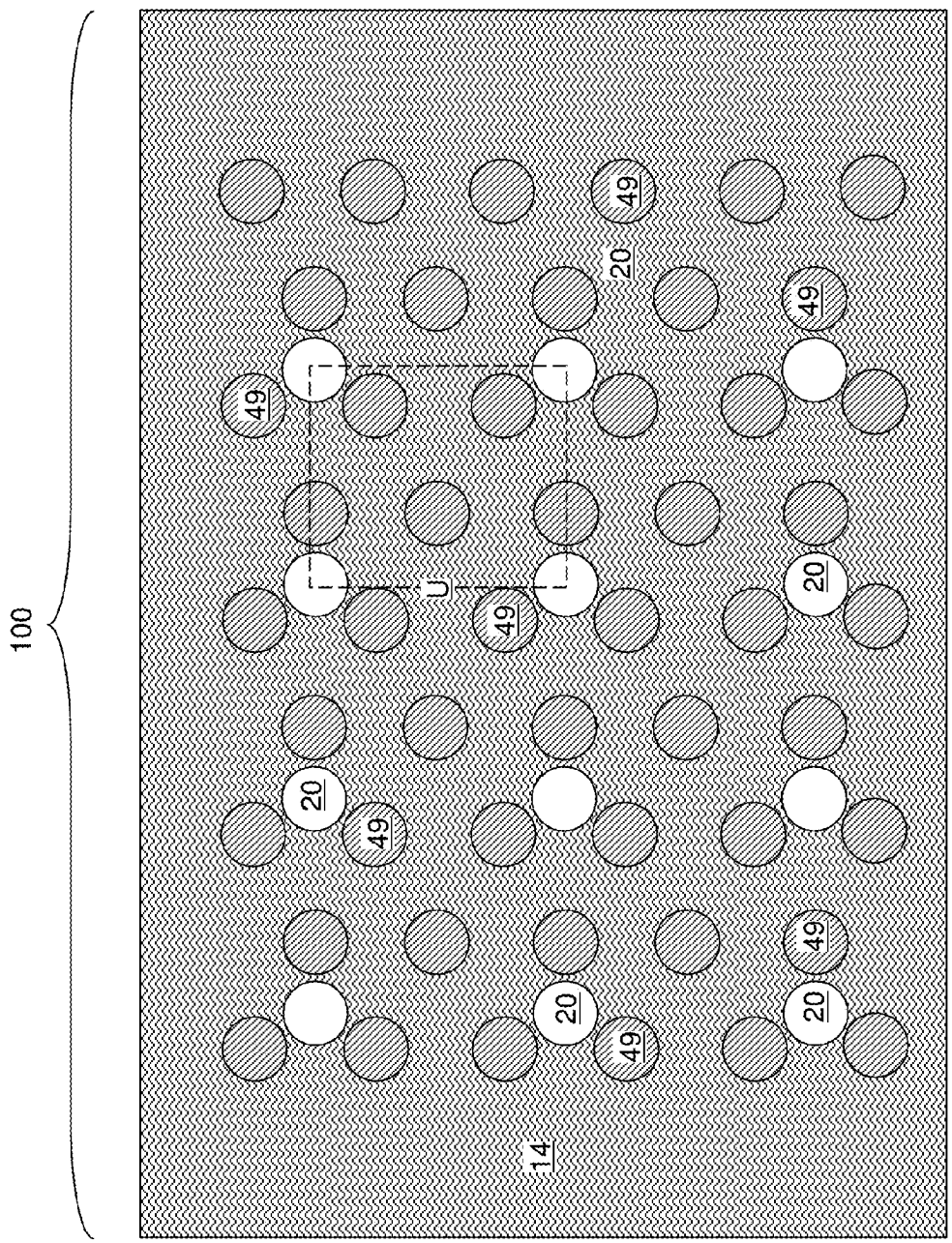
Figure 7C:
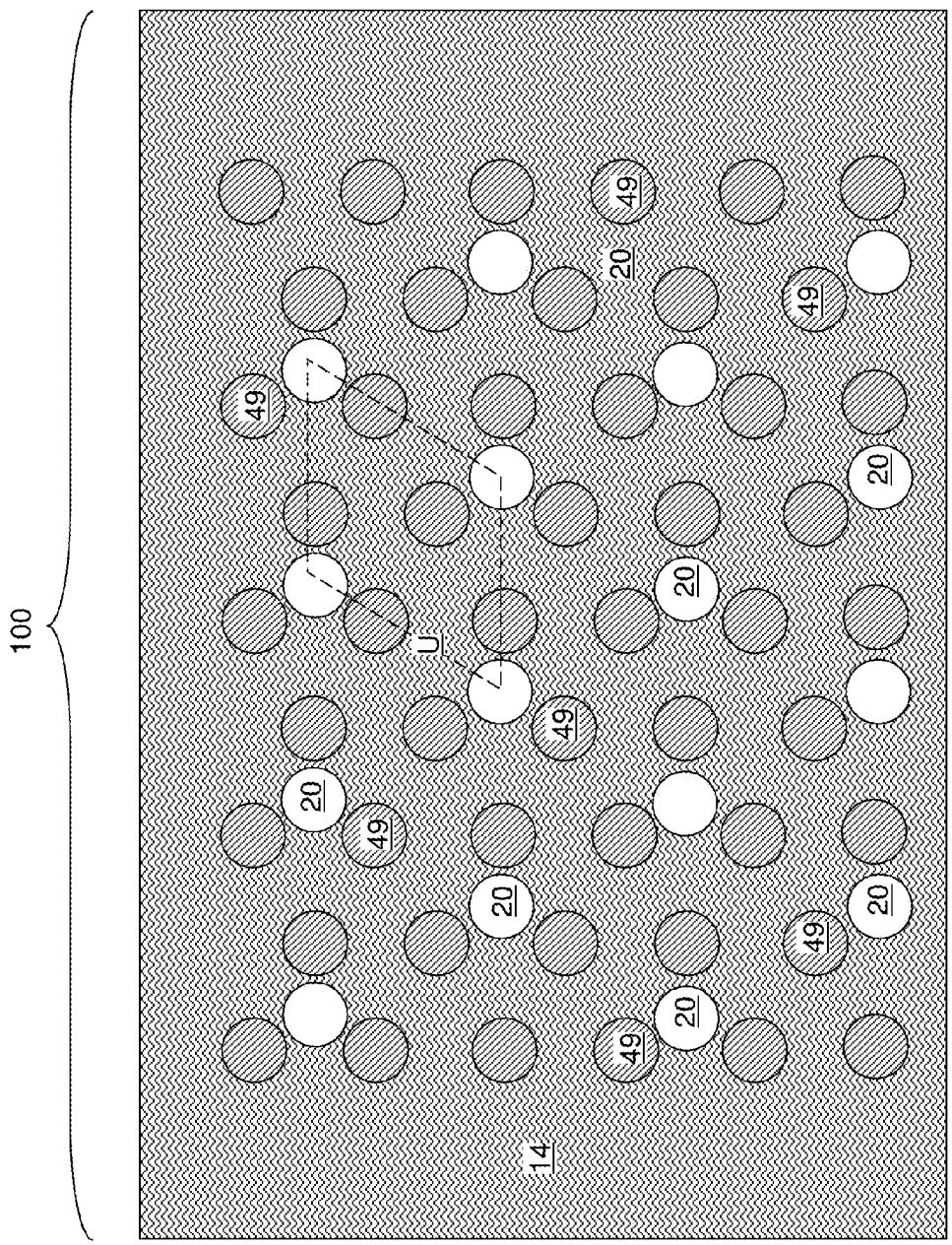

FIG. 7A-7C illustrate the first, second, and third exemplary configurations, respectively, for the sacrificial material layer 14, the array of dielectric pillars 20, and the array of memory openings 49 in horizontal cross-sectional views along a horizontal plane that passes through the sacrificial material layer 14. In one embodiment, the array of dielectric pillars 20 and the array of memory openings 49 collectively constitute a two-dimensional periodic array of multiple instances of a unit cell structure "U". The unit cell structure U can include multiple memory openings 49 (such as four memory opening as illustrated in FIGS. 7A-7C) and at least one dielectric pillar 20 (which may be two dielectric pillars 20 composed of one whole pillar inside the unit cell and quarters of the four pillars at the vertices of the unit cell as illustrated in FIG. 7A, or a single dielectric pillar 20 composed of quarters of the four pillars at the vertices of the unit cell as illustrated in FIGS. 7B and 7C). In one embodiment, the array of memory openings 49 can comprise a hexagonal array of memory openings 49. In one embodiment, the ratio of the total number of the multiple memory openings 49 in the unit cell structure U to the total number of the at least one dielectric pillar 20 in the unit cell structure U can be in a range from 2 to 4. For example, the ratio can be 2 as illustrated in FIG. 7A, or 4 as illustrated in FIG. 7B, or 3 as illustrated in FIG. 7C.

A memory stack structure can be formed in each memory opening 49 in subsequent processing steps. FIGS. 8A-8D illustrate the process of forming a memory stack structure in a memory opening 49. While a particular embodiment is illustrated herein for formation of memory stack structures, embodiments are expressly contemplated herein in which different types of memory stack structures are formed.

Referring to FIG. 8A, a memory opening 49 is illustrated. The memory opening 49 extends through the insulating cap layer 70, the alternating stack (32, 42) and the layer stack of the upper source insulating layer 16, the sacrificial matrix layer 14, and the lower source insulating layer 12, and optionally into an upper portion of the substrate semiconductor layer 10. The recess depth of the bottom surface of each memory opening 49 with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, a set of layers for formation of a memory film is deposited within each memory opening. The set of layers may include, for example, an optional outer blocking dielectric layer 502L, an optional inner blocking dielectric layer 503L, a charge storage element layer 504L, and a tunneling dielectric layer 506L.

Specifically, each of the outer and inner blocking dielectric layers (502L, 503L) can includes at least one dielectric material, which can be silicon oxide, a dielectric metal oxide, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, at least one of the outer and inner blocking dielectric layers (502L, 503L) can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide can be deposited, for example, by chemical vapor deposition (CVD), atomic layer deposition (ALD), pulsed laser deposition (PLD), liquid source misted chemical deposition, or a combination thereof. Additionally or alternately, at least one of the outer and inner blocking dielectric layers (502L, 503L) can include silicon oxide, silicon oxynitride, silicon nitride, or a combination thereof. In one embodiment, the blocking dielectric layers (502L, 503L) can include a stack of aluminum oxide and silicon oxide. Each of the outer and inner blocking dielectric layers (502L, 503L) can be formed by a conformal deposition method such as low pressure chemical vapor deposition, atomic layer deposition, or a combination thereof. The thickness of the blocking dielectric layers (502L, 503L) can be in a range from 1 nm to 30 nm, although lesser and greater thicknesses can also be employed.

The charge storage element layer 504L can include a single layer of a charge trapping material including a dielectric charge trapping material, which can be, for example, silicon nitride. Alternatively, the charge storage element layer 504L can include a conductive material such as doped polysilicon or a metallic material that is patterned into multiple electrically isolated portions (e.g., floating gates), for example, by being formed within lateral recesses into sacrificial material layers 42. In one embodiment, the charge storage element layer 504L includes a silicon nitride layer.

The charge storage element layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage element layer 504L may comprise an insulating charge trapping material, such as one or more silicon nitride segments. Alternatively, the charge storage element layer 504L may comprise conductive nanoparticles such as metal nanoparticles, which can be, for example, ruthenium nanoparticles. The charge storage element layer 504L can be formed, for example, by chemical vapor deposition (CVD), atomic layer deposition (ALD), physical vapor deposition (PVD), or any suitable deposition technique for storing electrical charges therein. The thickness of the charge storage element layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

In an illustrative example, the optional outer blocking dielectric layer 502L can include a dielectric metal oxide such as aluminum oxide, and the inner blocking dielectric layer 503L can include a dielectric oxide of a semiconductor material such as silicon oxide. The charge storage element layer 504L can include any type of charge storage material, and may be formed as a continuous material layer including a charge trapping material, or may be formed as a plurality of vertically isolated charge trapping material portions that are located at each level of the sacrificial material layers 42, for example, by being deposited in recessed regions by a combination of a conformal deposition process and an anisotropic etch. The tunneling dielectric layer 506L includes a material that can be employed as a tunneling dielectric material, which can be, for example, silicon oxide or an ONO stack.

A semiconductor channel layer 60L can be deposited over the tunneling dielectric layer 506L. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. A cavity 49' is formed in the volume of each memory opening 49 that is not filled with the deposited material layers (502L, 503L, 504L, 506L, 60L).

Figure 8C:
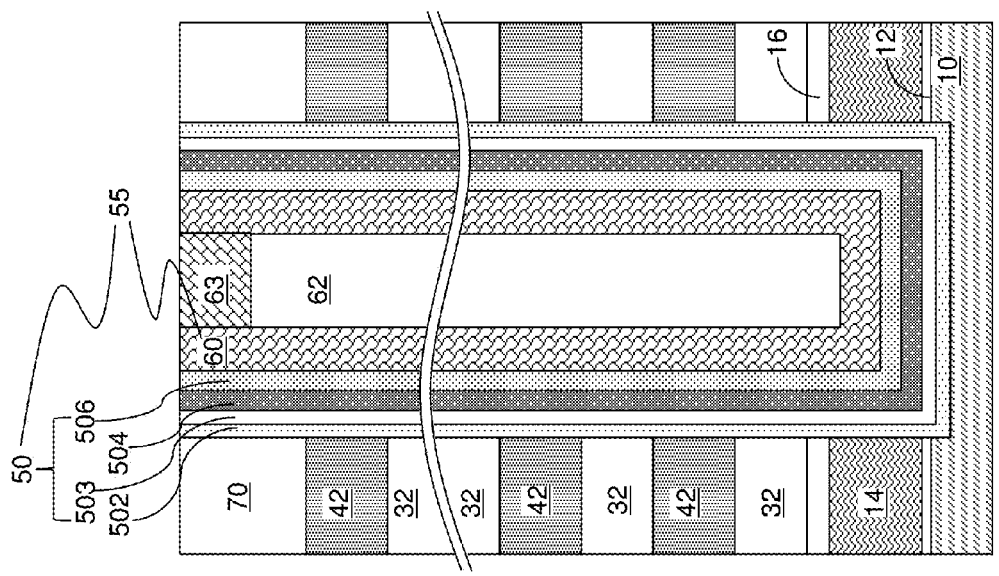

Referring to FIG. 8C, a dielectric material can be deposited to fill the cavity 49' within each memory opening 49. The dielectric material can be deposited by a conformal deposition method such as low pressure chemical vapor deposition (LPCVD), or by a self-planarizing deposition process such as spin coating. Exemplary dielectric materials that can be employed to fill the cavities 49' include silicon oxide (undoped silicate glass or doped silicate glass) and organosilicate glass.

A planarization process can be performed to remove excess portions of the dielectric material, the semiconductor channel layer 60L, the tunneling dielectric layer 506L, the charge storage element layer 504L, and the blocking dielectric layers (502L, 503L) from above the horizontal plane including the top surface of the insulating cap layer 70. A recess etch and/or chemical mechanical planarization process can be employed. Each remaining portion of the outer blocking dielectric layer 502L in a memory opening constitutes an outer blocking dielectric 502. Each remaining portion of the inner blocking dielectric layer 503L in a memory opening constitutes an inner blocking dielectric 503. Each remaining portion of the charge storage element layer 504L in a memory opening includes charge storage elements 504 (which may be embodied as a single continuous memory material layer (charge storage layer) or as discrete charge storage material portions located at each level of the sacrificial material layers 42). In one embodiment, portions of a single continuous memory material layer including a charge trapping dielectric material (such as silicon nitride) that are located at levels of the sacrificial material layers 42 constitute the charge storage elements, while portions of the same single continuous memory material layer located at each level of the insulating layers 32 provide electrical isolation among vertically neighboring charge storage elements. Each remaining portion of the tunneling dielectric layer 506L in a memory opening constitutes a tunneling dielectric 506. Each remaining portion of the semiconductor channel layer 60L in a memory opening constitutes a semiconductor channel 60, which includes a vertical semiconductor channel that extend along the vertical direction. Each remaining portion of the dielectric material constitutes a dielectric core 62. Each adjoining set of an optional outer blocking dielectric 502, an inner blocking dielectric 503, a set of charge storage elements 504, and a tunneling dielectric 506 collectively constitute a memory film 50.

Figure 8D:
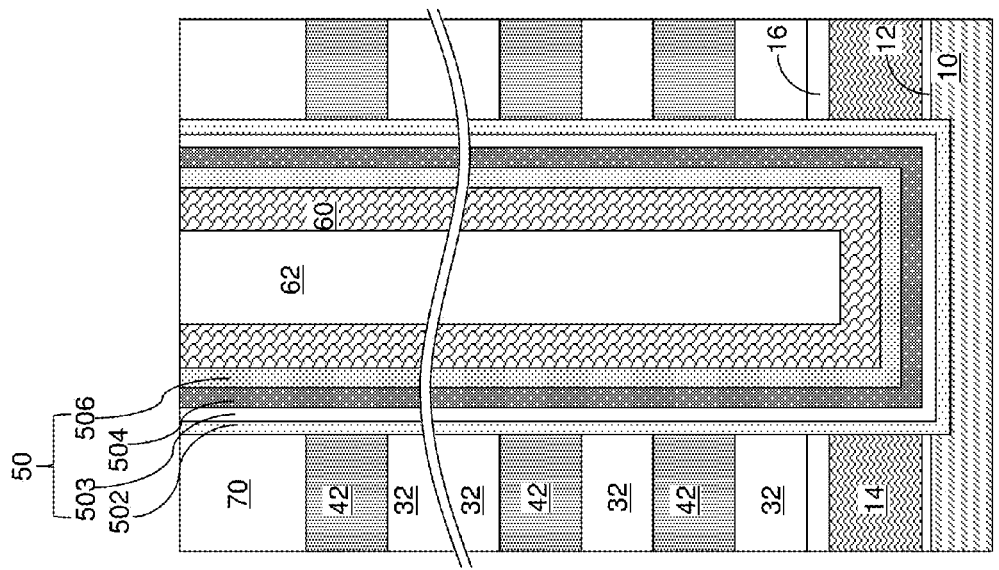

Referring to FIG. 8D, each dielectric core 62 can be vertically recessed, for example, by a recess etch with respect to the memory film 50. The recess etch of the dielectric core 62 may, or may not, be selective to the semiconductor channel 60. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Each set of a memory film 50 and a semiconductor channel 60 located within a same memory opening constitutes a memory stack structure 55.

Figure 9:
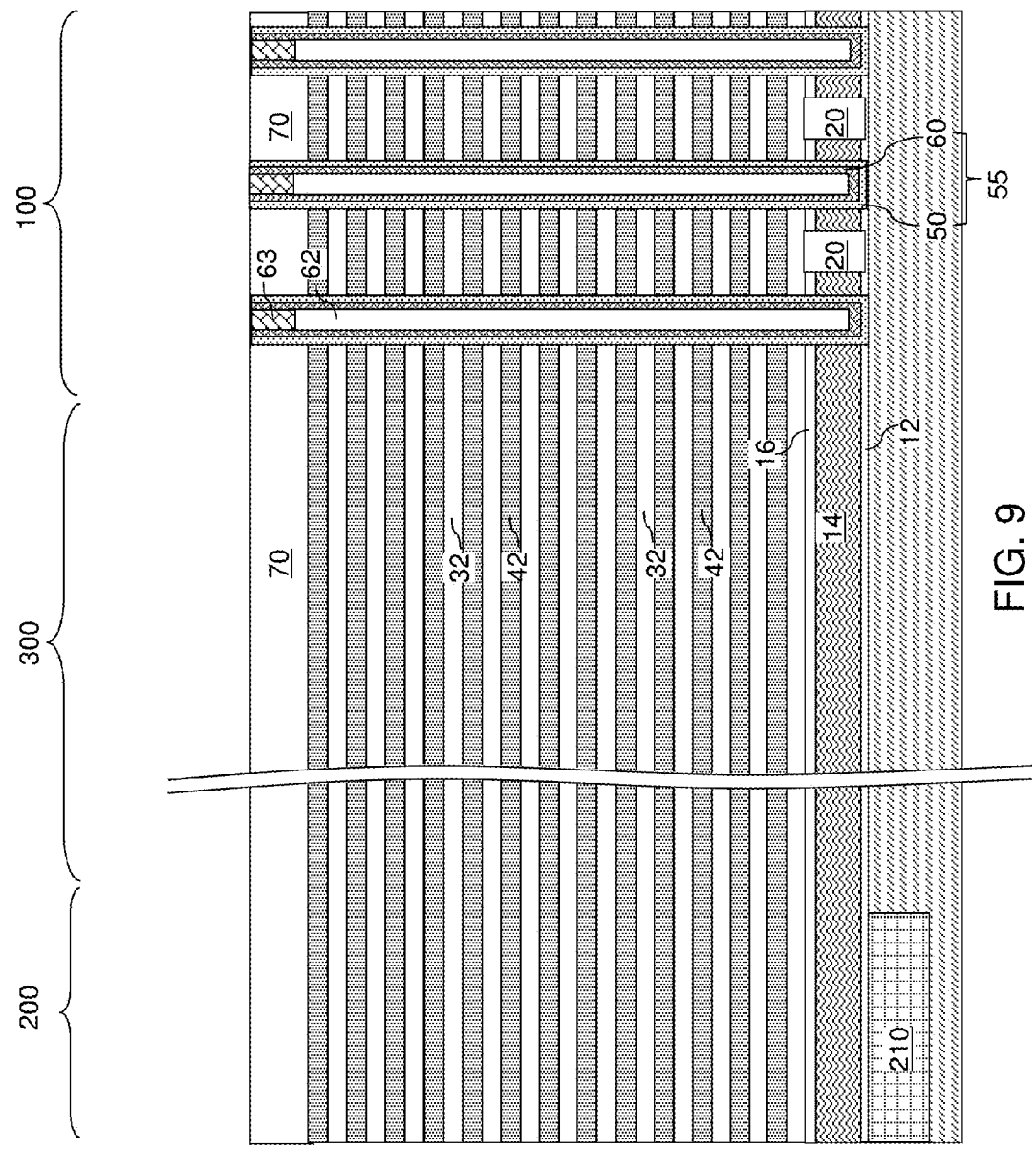
FIG. 9 is a vertical cross-sectional view of the exemplary structure after formation of memory stack structures according to an embodiment of the present disclosure.

FIG. 9 illustrates the exemplary structure that incorporates multiple instances of the exemplary memory stack structure 55 of FIG. 8D. Each memory stack structure 55 includes from outside to inside, at least one optional blocking dielectric (502, 503) (which may include an outer blocking dielectric 502 and an inner blocking dielectric 503), charge storage elements 504 that may be memory elements (as embodied vertically spaced portions of a memory material layer located at levels of each sacrificial material layers 42), a tunneling dielectric 506, and a semiconductor channel 60. While the present disclosure is described employing the illustrated configuration for the memory stack structure, the methods of the present disclosure can be applied to alternative memory stack structures including a polycrystalline semiconductor channel.

Figure 10:
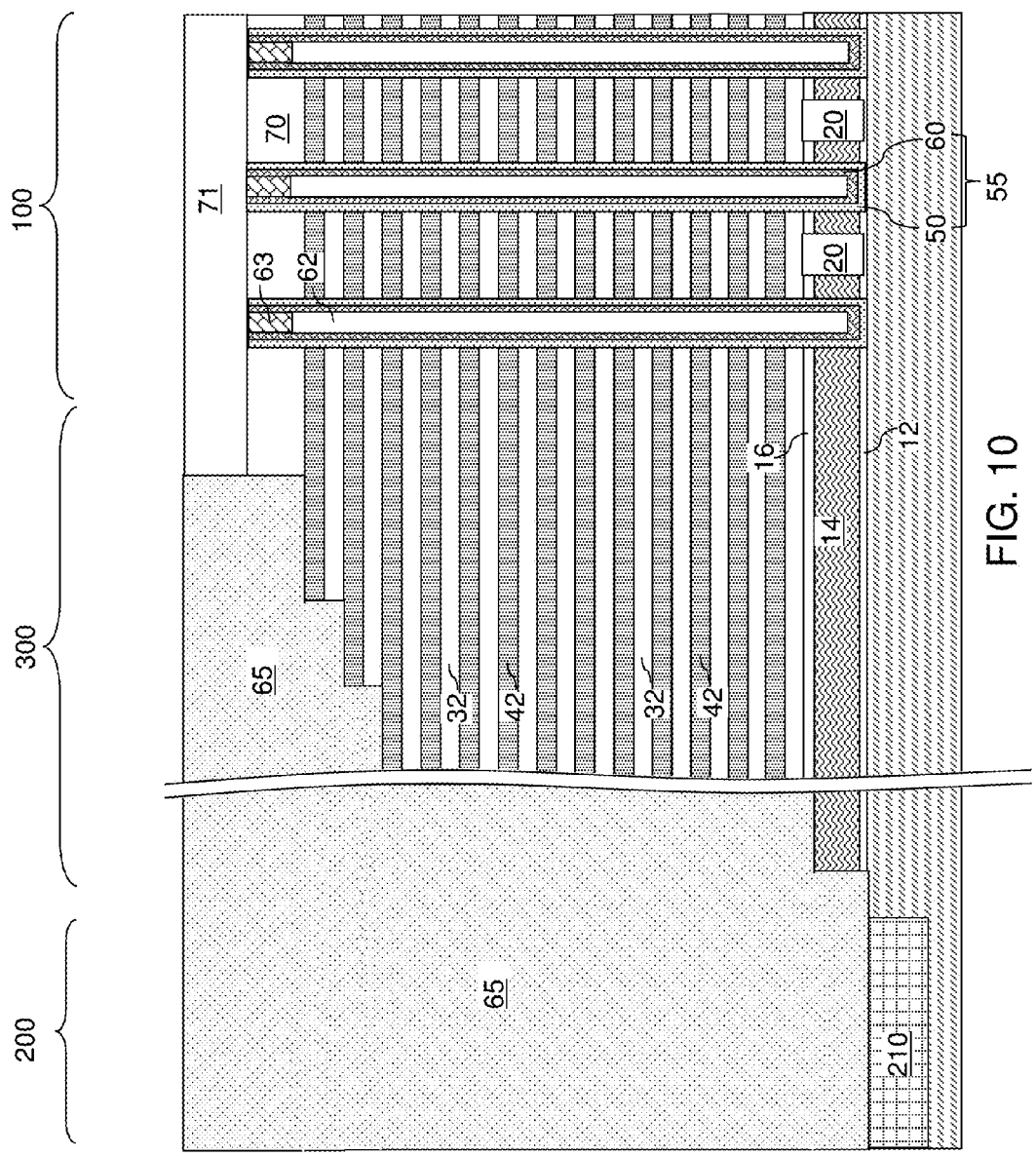
FIG. 10 is a vertical cross-sectional view of the exemplary structure after formation of a set of stepped surfaces and a retro-stepped dielectric material portion according to an embodiment of the present disclosure.

Referring to FIG. 10, an optional first contact level dielectric layer 71 can be formed over the substrate semiconductor layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, the alternating stack (32, 42), and the layer stack of the upper source insulating layer 16, the sacrificial matrix layer 14, and the lower source insulating layer 12 can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate semiconductor layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 11:
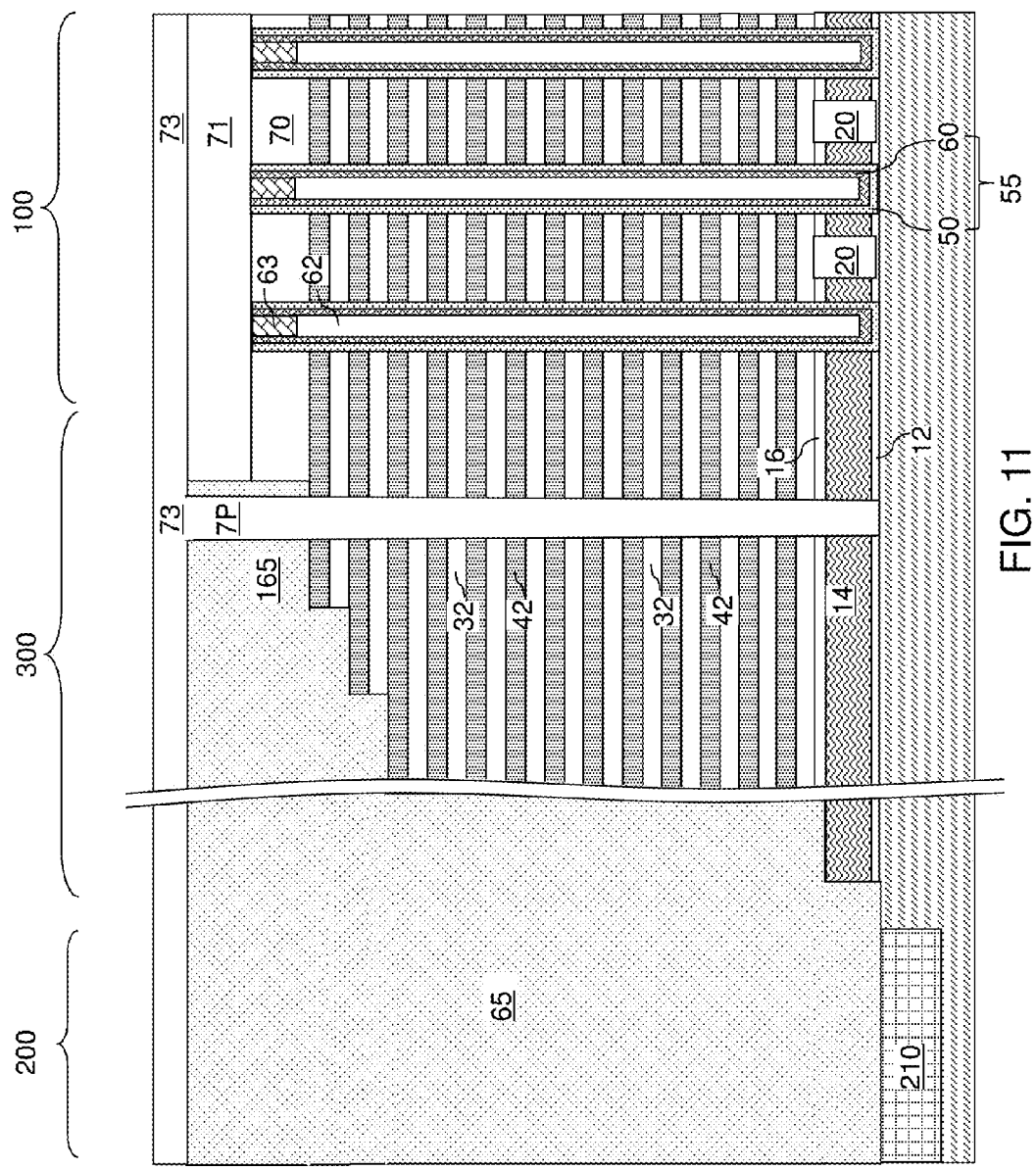
FIG. 11 is a vertical cross-sectional view of the exemplary structure after formation of through-stack dielectric support pillars according to an embodiment of the present disclosure.

Referring to FIG. 11, through-stack dielectric support pillars 7P may be optionally formed through the retro-stepped dielectric material portion 65 and/or through the first contact level dielectric layer 71 and/or through the alternating stack (32, 42). In one embodiment, the through-stack dielectric support pillars 7P can be formed in the contact region 300, which is located adjacent to the device region 100. The through-stack dielectric support pillars 7P can be formed, for example, by forming an opening extending through the retro-stepped dielectric material portion 65 and/or through the alternating stack (32, 42) and at least to the top surface of the substrate semiconductor layer 10, and by filling the opening with a dielectric material that is resistant to the etch chemistry to be employed to remove the sacrificial material layers 42.

In one embodiment, the through-stack dielectric support pillars 7P can include silicon oxide and/or a dielectric metal oxide such as aluminum oxide. In one embodiment, the portion of the dielectric material that is deposited over the first contact level dielectric layer 71 concurrently with deposition of the through-stack dielectric support pillars 7P can be present over the first contact level dielectric layer 71 as a second contact level dielectric layer 73. Each of the through-stack dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the through-stack dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the through-stack dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 12A:
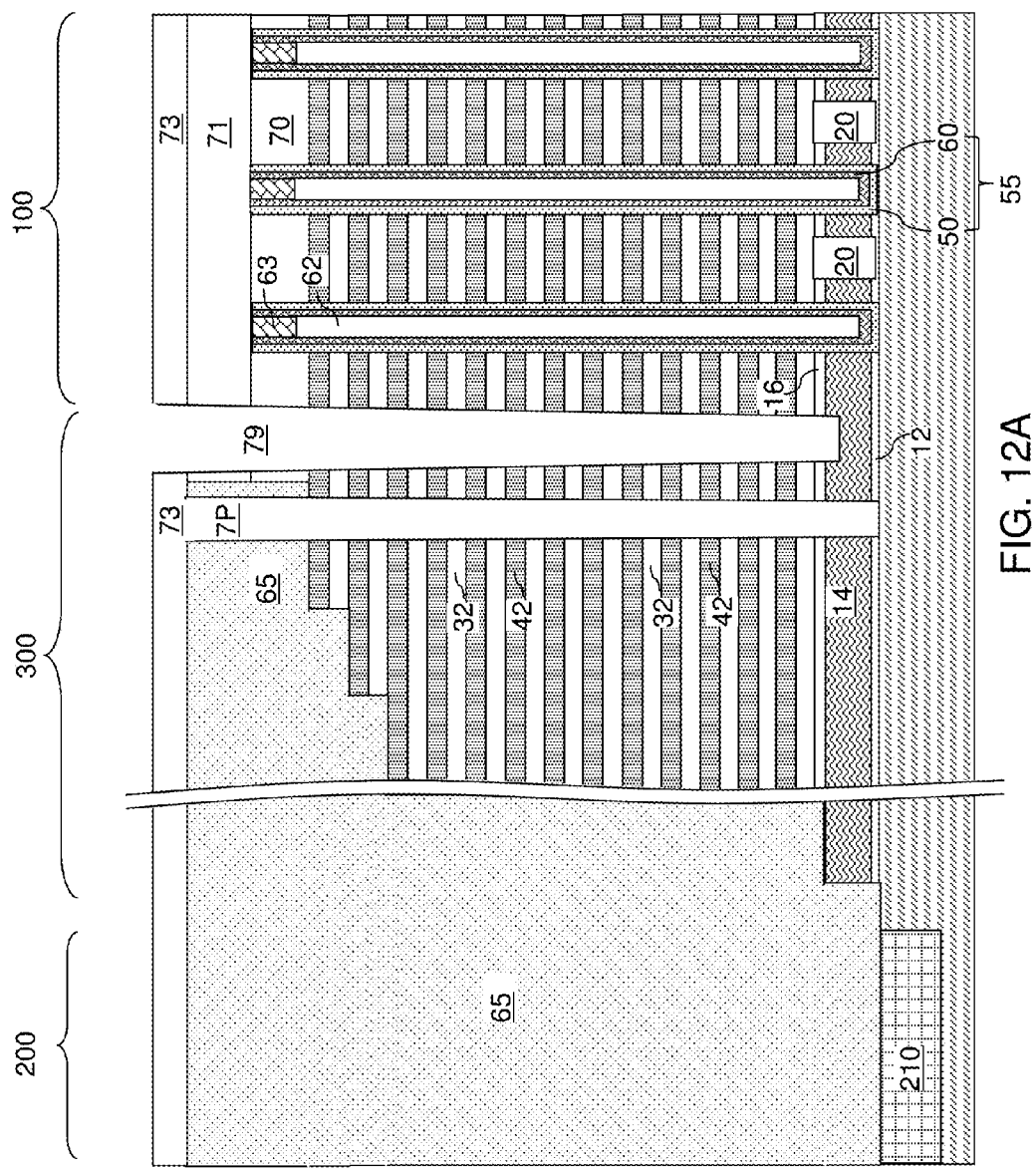
FIG. 12A is a vertical cross-sectional view of the exemplary structure after formation of backside trenches according to an embodiment of the present disclosure.
Figure 12B:
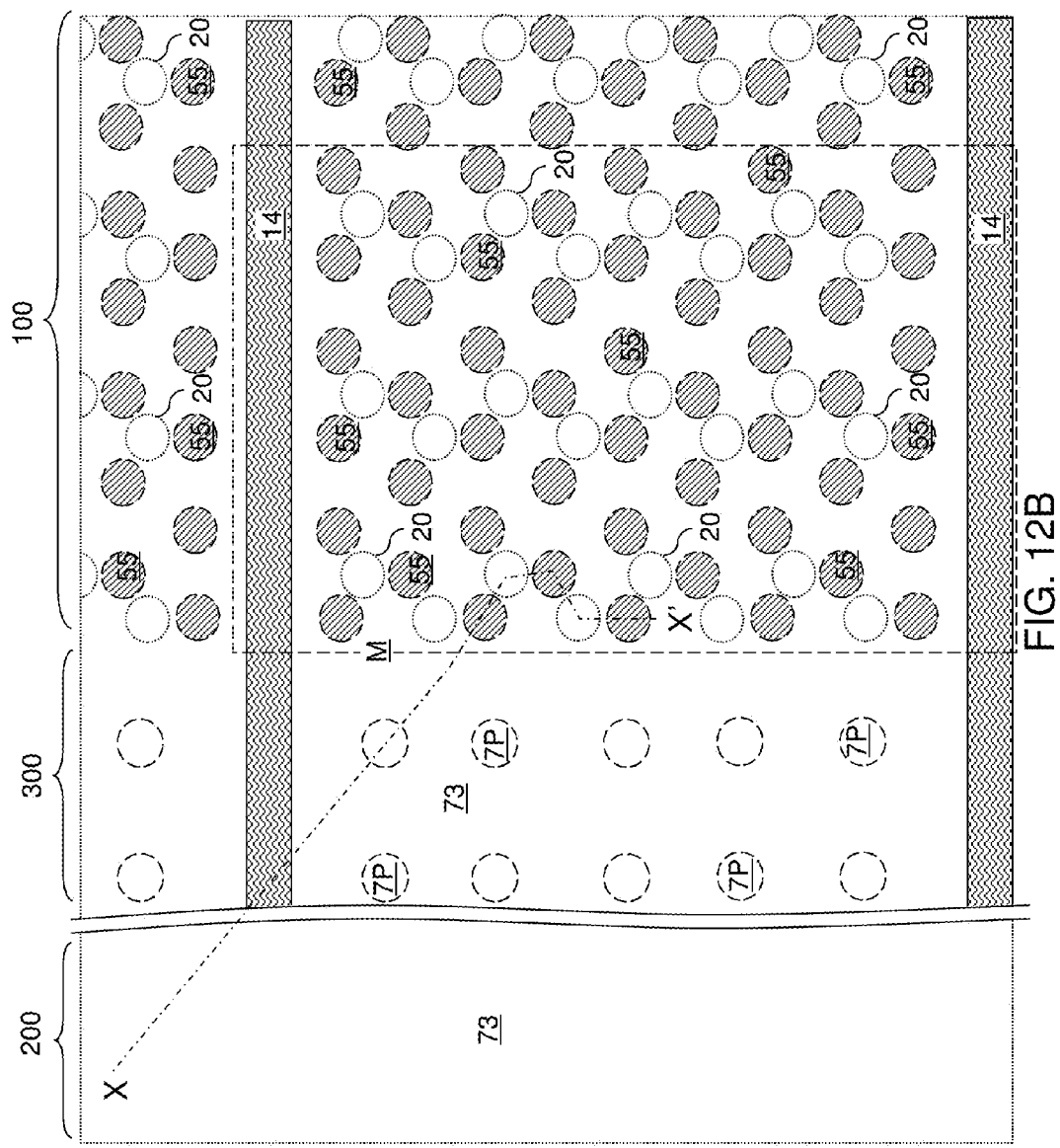
FIG. 12B is a see-through top-down view of the exemplary structure of FIG. 12A. The zigzag vertical plane A-A' is the plane of the vertical cross-sectional view of FIG. 12A for the case of the first exemplary configuration.

Referring to FIGS. 12A and 12B, a photoresist layer (not shown) can be applied over the at least one contact level dielectric layer (71, 73), and can be lithographically patterned to form openings within areas between the memory blocks. In one embodiment, each opening in the photoresist layer can have a rectangular shape such that a pair of sidewalls of an opening laterally extends along a first horizontal direction.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, the alternating stack (32, 42), and the optional upper source insulator layer 16 (if present). The sacrificial matrix layer 14 can be physically exposed at the bottom of each backside trench 79. Clusters of the memory stack structures 55 can be laterally spaced by the backside trenches 79. Each cluster of memory stack structures 55 in conjunction with the portions of the alternating stack (32, 42) that surround the cluster constitutes a memory block. A memory block can be laterally bounded by a pair of backside trenches 79. FIG. 12A is a vertical cross-sectional view along the zigzag vertical plane X-X' in FIG. 12B. FIG. 12B is a see-through top-down view in which underlying elements are shown in dotted lines.

Figure 13B:
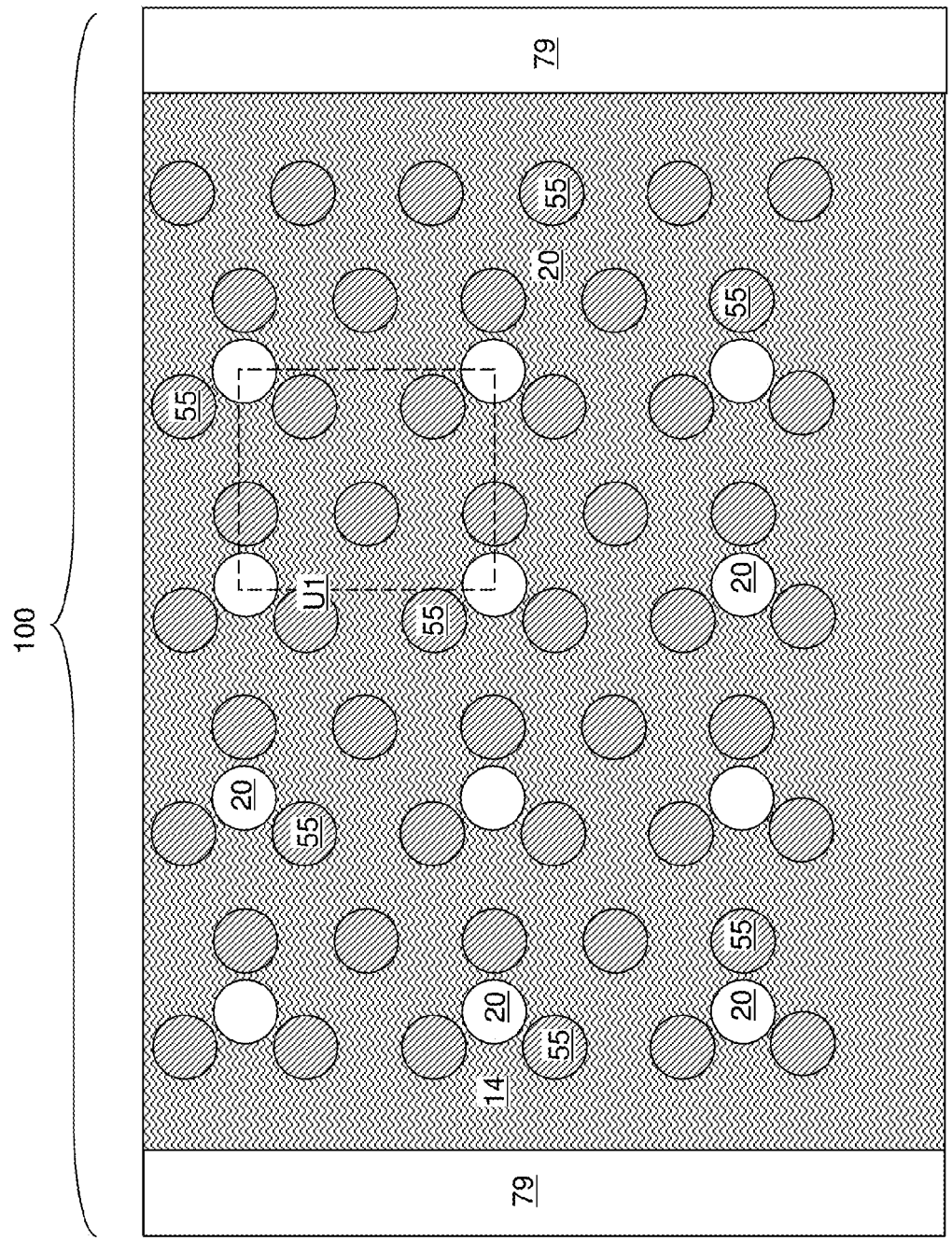
Figure 13C:
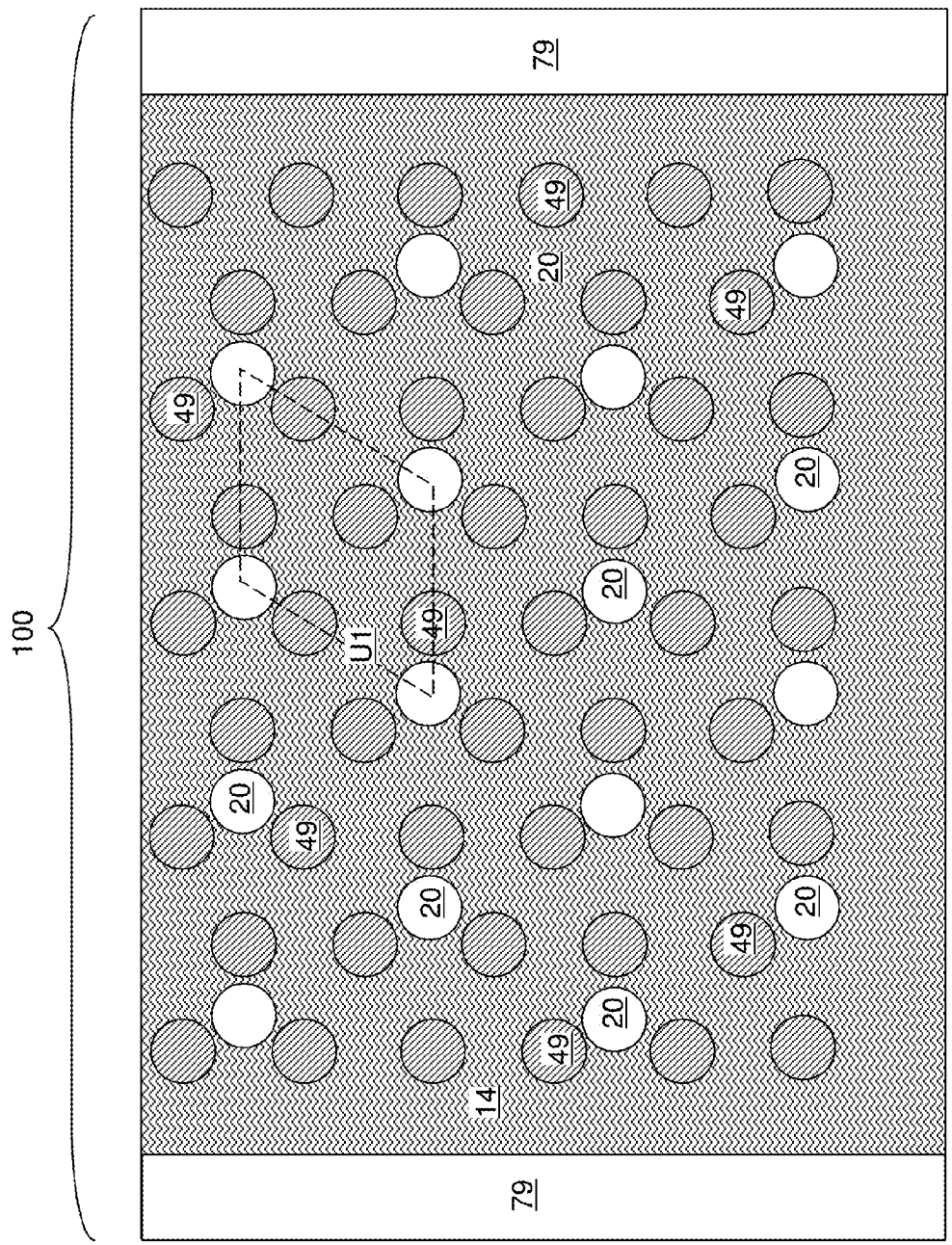

FIG. 13A illustrates a horizontal cross-sectional view of a dotted rectangular region "M" of the exemplary structure of FIG. 12B along a horizontal plane including the sacrificial matrix layer 14 shown in FIG. 12A. The view in FIG. 13A correspond to the first (i.e., zigzag) configuration for the array of dielectric pillars 20 and the array of memory stack structures 55. FIGS. 13B and 13C show the corresponding horizontal cross-sectional views for the second and third configurations. The direction of the zigzag rows of pillars 20 in FIGS. 12B and 13A extend in the bit line direction perpendicular to the trench 79 elongation direction and the word line direction. However, in another embodiment, the direction of the zigzag rows of pillars 20 in FIGS. 12B and 13A may be rotated by 90 degreed to extend perpendicular to the bit line direction, and parallel to the trench 79 elongation direction and the word line direction.

The array of dielectric pillars 20 and the array of memory stack structures 55 collectively constitute a two-dimensional periodic array of multiple instances of a unit cell structure U1 that includes multiple memory stack structures 55 and at least one dielectric pillar 20. The array of memory stack structures 55 can comprise an hexagonal array of memory stack structures 55. The ratio of the total number of the multiple memory stack structures 55 in the unit cell structure U1 to the total number of the at least one dielectric pillar 20 in the unit cell structure U1 can be in a range from 2 to 4.

Figure 14:
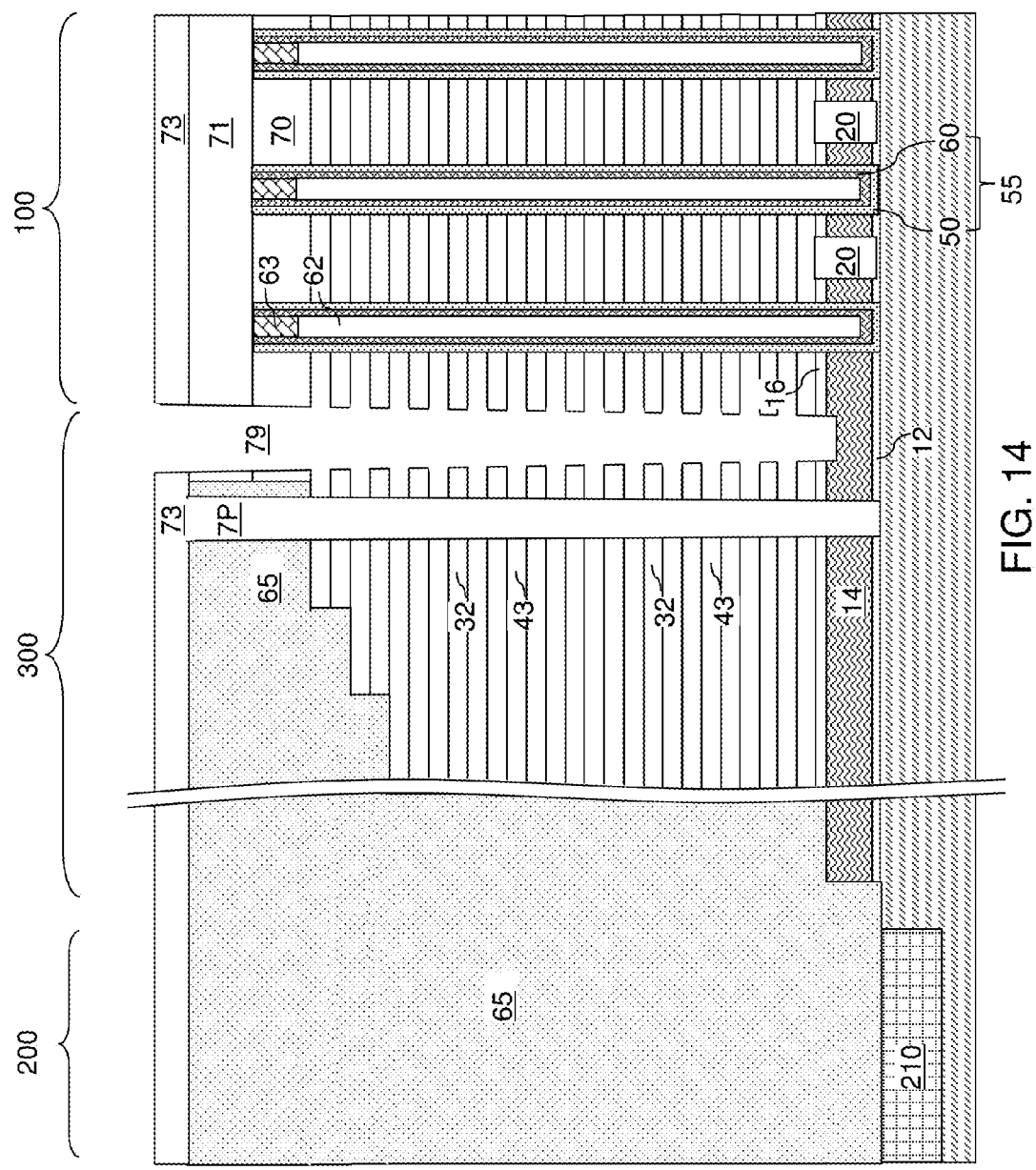
FIG. 14 is a vertical cross-sectional view of the exemplary structure after formation of backside recesses according to an embodiment of the present disclosure.

Referring to FIG. 14, backside recesses 43 can be formed by removing the sacrificial material layers 42 selective to the insulating layers 32 and the sacrificial matrix layer 14. Specifically, an etchant that selectively etches the second material of the sacrificial material layers 42 with respect to the first material of the insulating layers 32 and the sacrificial matrix layer 14 can be introduced into the backside trenches 79, for example, employing an etch process. The backside recesses 43 are formed in volumes from which the sacrificial material layers 42 are removed. The removal of the second material of the sacrificial material layers 42 can be selective to the first material of the insulating layers 32, the material of the through-stack dielectric support pillars 7P, the material of the retro-stepped dielectric material portion 65, the semiconductor material of the substrate semiconductor layer 10, the material of the sacrificial matrix layer 14, and the material of the outermost layer (such as the outer blocking dielectrics 502) of the memory stack structures 55. In one embodiment, the sacrificial material layers 42 can include silicon nitride, the sacrificial matrix layer 14 can include polysilicon or amorphous silicon, and the materials of the insulating layers 32, the through-stack dielectric support pillars 7P, and the retro-stepped dielectric material portion 65 can be selected from silicon oxide and dielectric metal oxides.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42, the material of the silicon oxide layer 501, and the material of the silicon nitride layer 502 are removed. The memory openings in which the memory stack structures (50, 60) are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the substrate semiconductor layer 10). In this case, each backside recess 43 can define a space for receiving a respective word line of the array of monolithic three-dimensional NAND strings.

Each of the plurality of backside recesses 43 can extend substantially parallel to the top surface of the substrate semiconductor layer 10. A backside recess 43 can be vertically bounded by a top surface of an underlying insulating layer 32 and a bottom surface of an overlying insulating layer 32. In one embodiment, each backside recess 43 can have a uniform height throughout. In one embodiment, an optional backside blocking dielectric, such as an aluminum oxide dielectric, may be deposited into the backside recesses 43 in contact with the exposed portions of the memory film 50 in the backside recesses 43. In this embodiment, one or both of the front side blocking dielectric layers 502 and/or 503 may be omitted.

Figure 15:
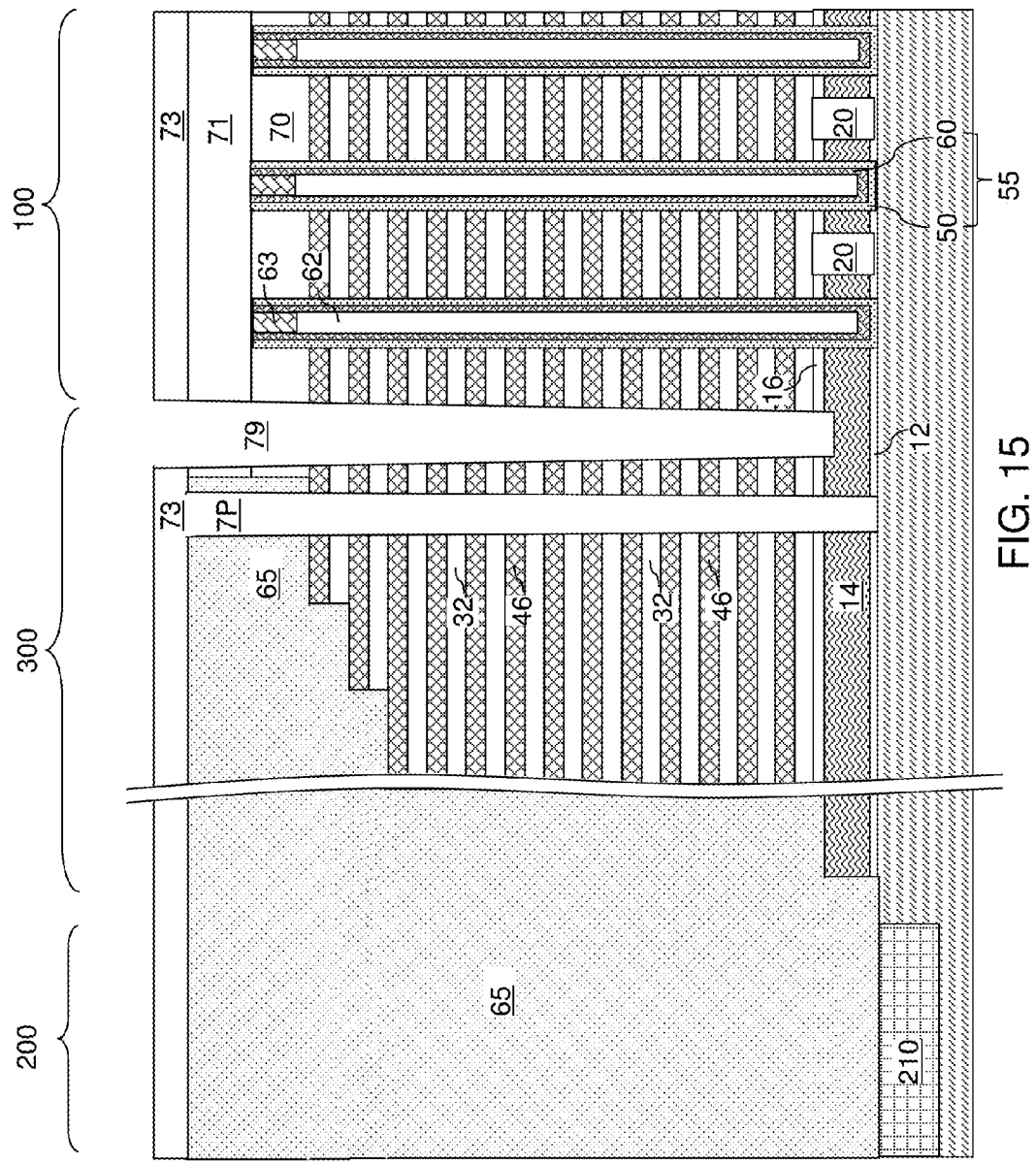
FIG. 15 is a vertical cross-sectional view of the exemplary structure after replacement of the sacrificial material layers with electrically conductive layers according to an embodiment of the present disclosure.

Referring to FIG. 15, at least one metallic material can be deposited in the backside recesses to form electrically conductive layers 46. Optionally, a backside blocking dielectric layer (not shown) can be formed on the physically exposed surfaces of the memory stack structures 55 and the insulating layers 32 prior to deposition of the at least one metallic material. In one embodiment, the at least one metallic material can include a conductive metallic compound layer (such as a conductive metal nitride layer including a conductive metal nitride such as TiN, TaN, or WN, or a conductive metal carbide layer including a conductive metal carbide such as TiC, TaC, or WC). The conductive metallic compound layer can include a metallic material that functions as a barrier material layer, i.e., a material layer that functions as a diffusion barrier for impurity atoms or gases, and/or as an adhesion promoter layer, i.e., a material layer that promotes adhesion of subsequent layers to the insulating layers 32 (in case a backside blocking dielectric layer is not employed) or to a backside blocking dielectric layer (in case a backside blocking dielectric layer is employed). The conductive metallic compound layer can be deposited by a conformal deposition process such as chemical vapor deposition (CVD) or atomic layer deposition (ALD). The thickness of the conductive metallic compound layer can be in a range from 1 nm to 6 nm, although lesser and greater thicknesses can also be employed.

In one embodiment, the at least one metallic material can further include a metal layer. The metal layer can include an elemental metal or an intermetallic alloy, which can be deposited in the remaining portions of the backside recesses 43, over the sidewalls of the backside trench 79, and over the top surface of the at least one contact level dielectric layer (71, 73). The metal layer can be deposited as a continuous metal layer directly on the surfaces of the conductive metallic compound layer. The metal layer can be deposited by a conformal deposition method such as chemical vapor deposition (CVD) or atomic layer deposition (ALD). Remaining portions of the backside recesses 43 can be filled with the metal layer. The thickness of the deposited metal, as measured on a sidewall of the backside trench 79, can be greater than one half of the maximum height of the remaining portions of the backside recesses 43 so that the entire volume of each backside recess 43 is filled with the combination of the optional backside blocking dielectric layer 58, the metallic compound layer, and the metal layer.

The metal layer can include a metal such as W, Co, Al, Cu, Ru, Au, Pt, or a combination thereof. The metal layer can be deposited by a chemical vapor deposition (CVD) process or an atomic layer deposition (ALD) process that employs a metal-containing precursor gas. In one embodiment, the metal-containing precursor gas can be free of fluorine, i.e., does not contain fluorine. Chemical vapor deposition or atomic layer deposition of metal employs a metal precursor that can be easily vaporized to leave high-purity metal on a surface without causing surface damage. In one embodiment, an organometallic compound with relatively high vapor pressures and good thermal stability can be employed as the metal precursor gas to deposit metal without requiring hydrogen.

Vertically-extending portions of the deposited metallic material(s) can cover the entirety of the sidewall of the backside trench 79. As deposited, a vertically-extending portion of the deposited metallic material(s) can be continuously adjoined to metal portions located within each vertically neighboring pair of backside recesses 43, and can be adjoined to a horizontal portion of the metal layer that overlies the at least one contact level dielectric layer (71, 73).

An etch process can be performed to remove the at least one metallic material from above the at least one contact level dielectric layer (71, 73) and from the sidewalls of the backside trenches 79. The etch process can include an isotropic etch step, an anisotropic etch step, or a combination thereof. In an illustrative example, a reactive ion etch employing at least one halide-containing gas such as $CHF_3$, $CClF_3$, $CF_4$, $SF_6$, $SiF_4$, $Cl_2$, $NF_3$ can be employed for the etch process. Optionally, oxidants such as $O_2$ or $O_3$ can be employed in combination with the at least one halide-containing gas. The electrically conductive layers 46 remain around each backside trench 79 as discrete layers that are electrically isolated from one another.

Figure 16:
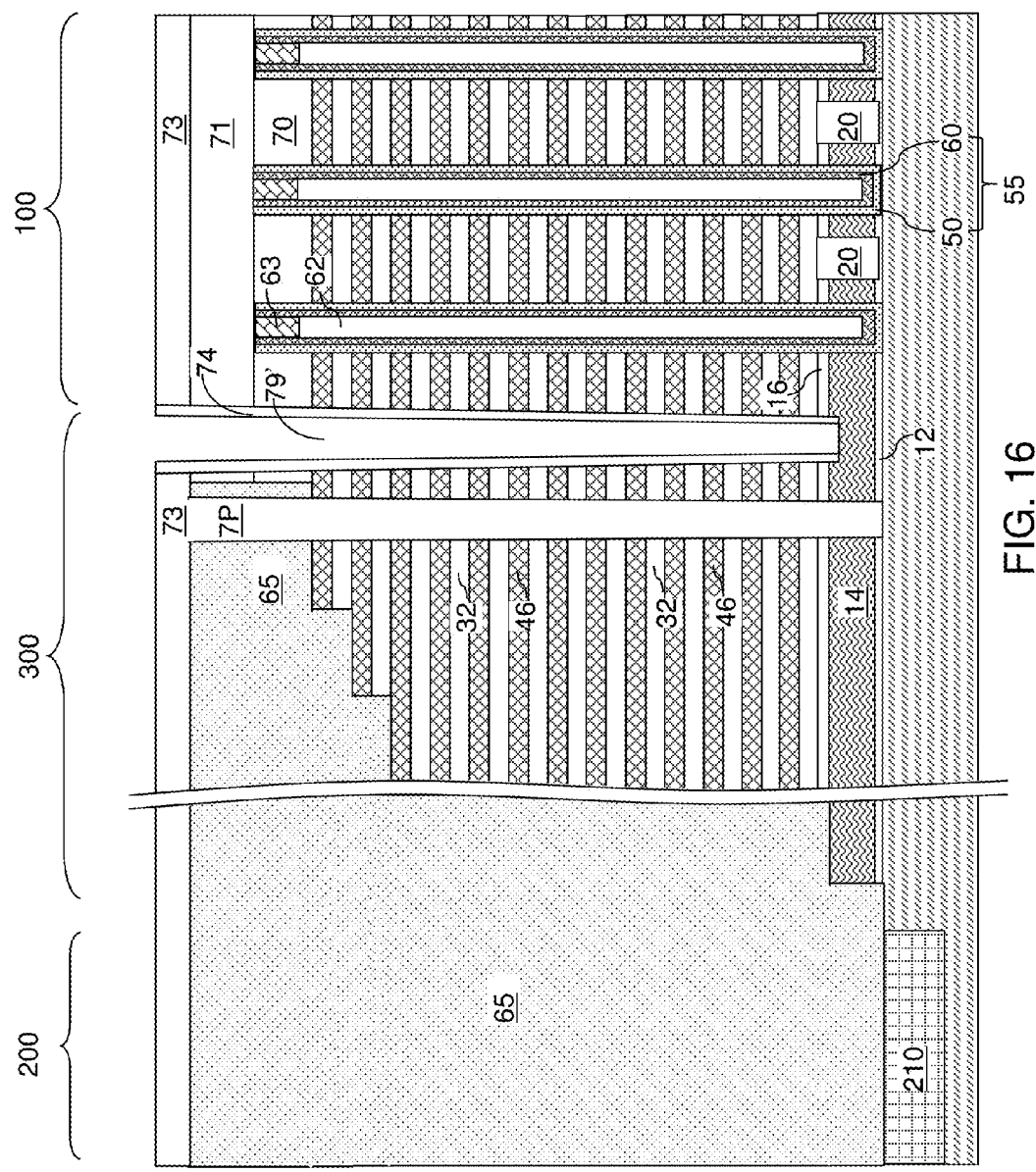
FIG. 16 is a vertical cross-sectional view of the exemplary structure after formation of an insulating spacer according to an embodiment of the present disclosure.

Referring to FIG. 16, an insulating spacer 74 can be formed on the sidewalls of each backside trench 79 by deposition of a continuous dielectric material layer and an anisotropic etch that removes horizontal portions of the continuous dielectric material layer. Each insulating spacer 74 includes a dielectric material, which can comprise, for example, silicon oxide, silicon nitride, a dielectric metal oxide, a dielectric metal oxynitride, or a combination thereof. The thickness of each insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Each insulating spacer 74 has an outer sidewall that contacts the sidewalls of the insulating layers 32 and the electrically conductive layers 46, and the sidewalls of the upper source insulating layer 16. Further, each insulating spacer 74 can contact a surface of the sacrificial matrix layer 14. Thus, each insulating spacer 74 can be formed at a periphery of a respective backside trench 79 and over a portion of the sacrificial matrix layer 14 and on sidewalls of the upper source insulator layer 16.

Figure 17:
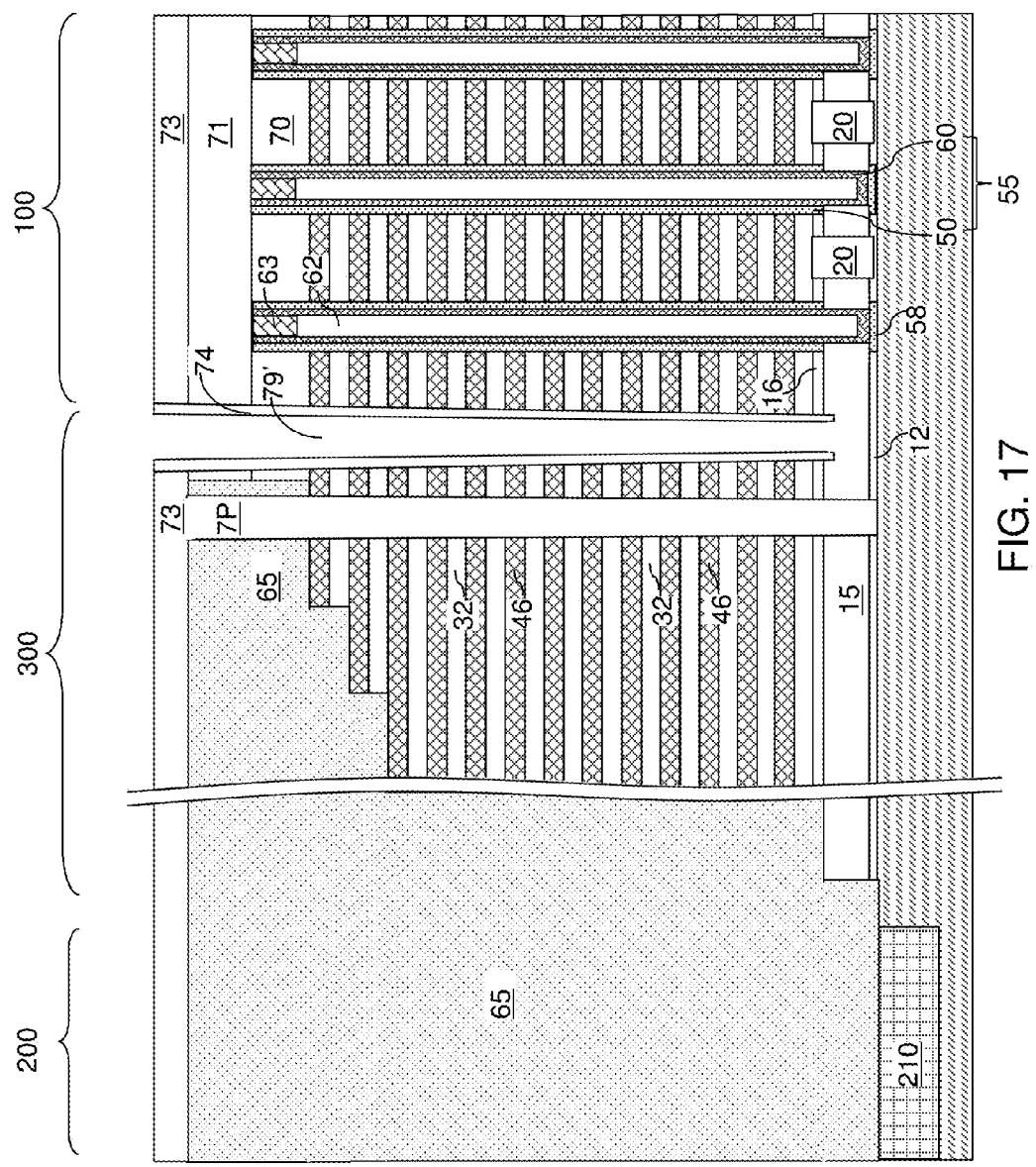
FIG. 17 is a vertical cross-sectional view of the exemplary structure after formation of a source line cavity by removing the sacrificial matrix layer according to an embodiment of the present disclosure.

Referring to FIG. 17, the sacrificial matrix layer 14 can be removed selective to the array of dielectric pillars 20, the lower source insulating layer 12, the upper source insulating layer 16, the through-stack dielectric pillar structures 7P, and the insulating spacers 74 to form a source line cavity 15. The sacrificial matrix layer 14 is preferably removed after formation of the electrically conductive layers 46. In one embodiment, the array of dielectric pillars 20, the lower source insulating layer 12, the upper source insulating layer 16, the through-stack dielectric pillar structures 7P, and the insulating spacers 74 can include various types of silicon oxide, and the sacrificial matrix layer 14 can include a semiconductor material (such as amorphous silicon, polysilicon or a silicon-germanium alloy), amorphous carbon, or an organic or inorganic polymer. For example, if the sacrificial matrix layer 14 includes polysilicon, a wet etch employing potassium hydroxide (KOH) may be employed to remove the sacrificial material layer 14 selective to the array of dielectric pillars 20, the lower source insulating layer 12, the upper source insulating layer 16, the through-stack dielectric pillar structures 7P, and the insulating spacers 74. Sidewalls of the memory stack structures 55 can be physically exposed to the source line cavity 15. Further, the sidewalls of the dielectric pillars 20 can be physically exposed to the source line cavity 15.

A physically exposed portion of each memory film 50 can be removed after removal of the sacrificial matrix layer 14. The physically exposed portions of the memory films 50 can be removed, for example, by an isotropic etch such as a wet etch. Thus, sidewalls of the semiconductor channels 60 become physically exposed at the level of the source line cavity 15. A remaining portion of each memory film 50 that underlies a physically exposed sidewall of a respective semiconductor channel 60 constitutes a dielectric cap plate 58, which underlies the semiconductor channel 60 and comprises a same set of dielectric materials as the remaining portion of the memory film 50 located above the source line cavity 15. Optionally, an annular source region 61 may be formed by introducing electrical dopants to a lower portion of each semiconductor channel 60 by plasma doping or gas phase doping.

In general, a polycrystalline silicon structure (embodied as a source region 61) can be provided at a lower end of each semiconductor channel 60 by deposition of a polysilicon material portion on the annular exposed portion of each semiconductor channel 60 and/or doping of an annular exposed portion of each semiconductor channel 60 located at the level of the source line cavity 15. Three types of polysilicon (including p+ type polysilicon, undoped polysilicon, and n+ type polysilicon) can be selected for the polycrystalline silicon structure, which can function as a polysilicon source region 61. Table 1 provides a summary of erase and read mechanisms for each type of polysilicon that is employed for a source region 61.

TABLE 1

Comparison of various types of source region

| Type of source polysilicon | Erase mechanism | Charge carrier for read operation |
| --- | --- | --- |
| N+ polysilicon | Gate-induced drain leakage (GIDL) erase only (both source and drain) | electrons |
| Undoped polysilicon | Gate-induced drain leakage (GIDL) erase only (both source and drain) | electrons |
| P+ polysilicon | Coupling erase (and partially GIDL erase) | holes |

The p+ polysilicon source region can employ coupling erase while other types of source regions can employ GIDL erase. The benefits of embodiments of the present disclosure include, but are not limited to, prevention of stack collapse employing a marginal device area increase (due to formation of the dielectric pillars 20). Removal of the sacrificial matrix layer 14 does not require use of a reactive ion etch, but an isotropic etch process may be employed to remove the sacrificial matrix layer 14.

Figure 18:
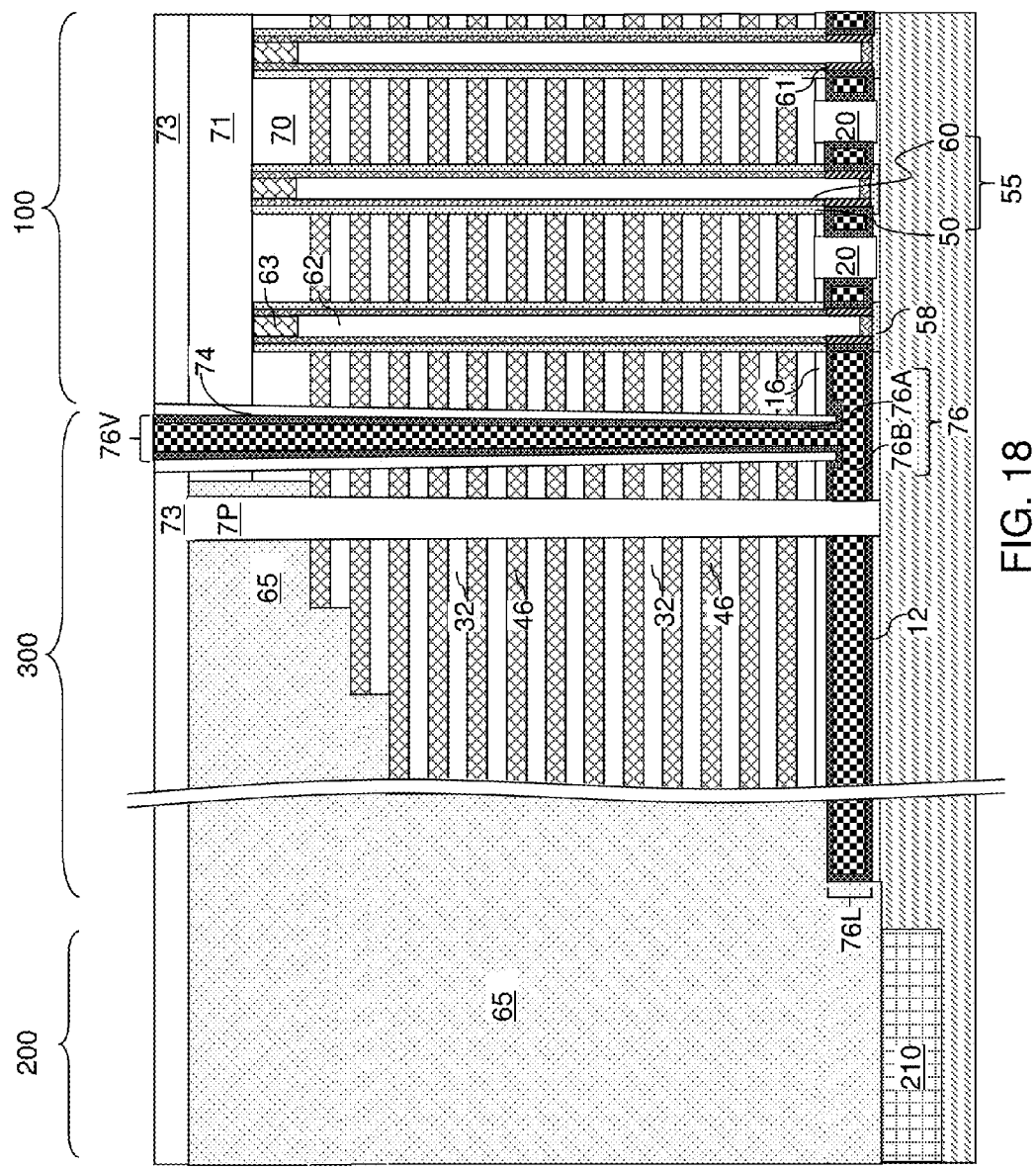
FIG. 18 is a vertical cross-sectional view of the exemplary structure after formation of a continuous source structure according to an embodiment of the present disclosure.

Referring to FIG. 18, at least one conductive material is deposited to form the source line cavity 15 by at least one conformal deposition method such as chemical vapor deposition (CVD), atomic layer deposition (ALD), electroplating, and/or electroless plating. In one embodiment, the at least one conductive material can include a metallic liner material such as a conductive metallic nitride or a conductive metallic carbide, and a metallic fill material such as W, Cu, Al, Co, Ru, and alloys thereof. For example, a metallic liner material layer 76A including the metallic liner material and a metallic fill material layer 76B including the metallic fill material can be deposited to fill the source line trench 15 and the backside trench 79 during a same set of deposition processes. Portions of the at least one conductive material above the horizontal plane including the top surface of the at least one contact level dielectric layer (71, 73) can be removed by a planarization process. In one embodiment, the planarization process can be a chemical mechanical planarization (CMP) process that employs one of the at least one contact level dielectric layer (71, 73) as a stopping layer. A continuous source structure 76 can be formed within each continuous volume of a source line trench 15 and at least one backside trench 79 connected to the source line trench 15. In one embodiment, a source line trench 15 can be connected to a plurality of backside trenches 79, and the continuous source structure 76 can fill the entirety of the continuous volume including the source line trench 15 and the plurality of backside trenches 79. The continuous source structures 76 can function as a source contact structure, or a combination of a source structure and a source contact structure.

The portion of each continuous source structure 76 that fills a source line cavity 15 is herein referred to as a source conductive layer 76L. Thus, the source matrix layer 14 is replaced with the source conductive layer 76L which extends in a horizontal direction parallel to the top surface of the substrate (i.e., the substrate semiconductor layer 10). The source conductive layer 76L can contact sidewalls of each dielectric pillar 20 in the array of dielectric pillars 20. Each portion of the continuous source structure 76 that fills a backside trench 79 constitutes a source conductive via structure 76V. Each source conductive via structure 76Vt extends vertically through the alternating stack (32, 46) perpendicular to the top surface of the substrate 10. The continuous source structure 76 is an integral structure without an interface between any of the source conductive via structures 76V and the source conductive layer 76L. As used herein, an "integral structure" refers to a single continuous structure that is not divided into multiple physically disjoined portions. As used herein, an "interface" refers to a microscopic interface between two elements that is characterized by differences in material composition, presence of a void, or presence of an interfacial material that can be detected by analytic means (such as transmission electron microscopy, scanning electron microscopy, and/or secondary ion mass spectroscopy).

Thus, the continuous source structure 76 can be formed by simultaneously filling the source line cavity 15 and the at least one backside trench 79 with at least one conductive material. Each source conductive via structure 76V is formed on an inner sidewall of a respective insulating spacer 74. The source line structure 76L can be formed directly on the source region 61 which comprises a deposited polysilicon layer on or a doped region in the exposed sidewall of each semiconductor channel 60.

Figure 19:
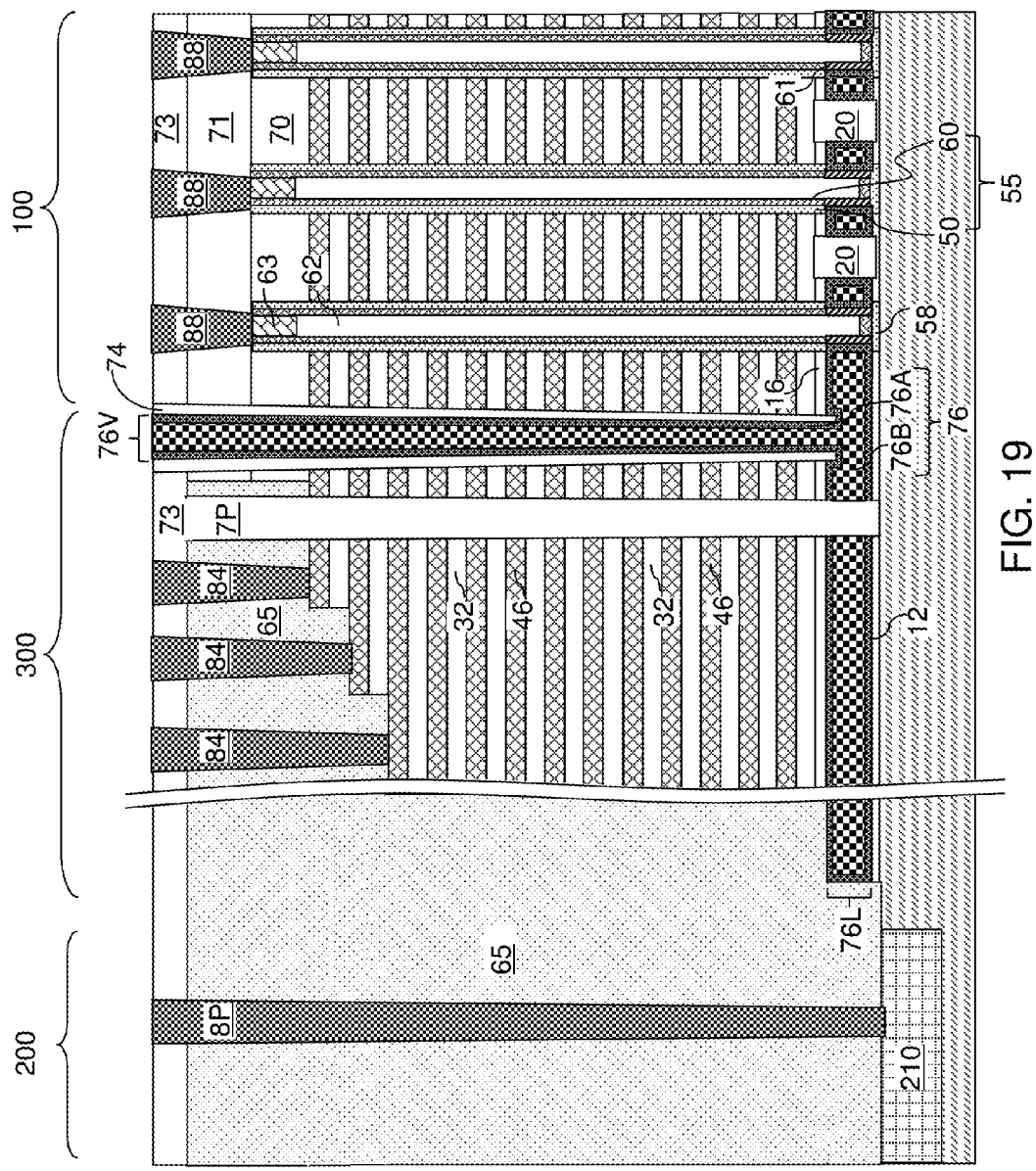
FIG. 19 is a vertical cross-sectional view of the exemplary structure after formation of various contact via structures according to an embodiment of the present disclosure.

Referring to FIG. 19, a photoresist layer (not shown) can be applied over the topmost layer of the exemplary structure (which can be, for example, the second contact level dielectric layer 73), and can be lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region 200.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the exemplary structure to provide electrical wiring among the various contact via structures.

The exemplary structure according to embodiments of the present disclosure can include a three-dimensional memory device. The three-dimensional memory device comprises an alternating stack of electrically conductive layers 46 and insulating layers 32 located over a substrate 10, and an array of memory stack structures 55. Each memory stack structure 55 extends through the alternating stack (32, 46), and includes a memory film 50 and a semiconductor channel 60 laterally surrounded by the memory film 50. The three-dimensional memory device can further include an array of dielectric pillars 20 located between the alternating stack (32, 46) and the substrate 10. A continuous source structure 76 can be provided, which includes a source conductive layer 76L that extends horizontally and laterally surrounds each dielectric pillar 20 in the array of dielectric pillars 20. The continuous source structure 76 can further include a source conductive via structure 76V that extends vertically through the alternating stack (32, 46). The continuous source structure 76 can be an integral structure without an interface between the source conductive via structure 76V and the source conductive layer 76L. The source conductive layer 76L may comprise a buried source line or electrode, while the source conductive via structure 76V may comprise a source local interconnect.

The three-dimensional memory device can include a lower source insulator layer 12 located between the substrate 10 and the source conductive layer 76L, an upper source insulator layer 16 located between the source conductive layer 76L and the alternating stack (32, 46), and an insulating spacer 74 laterally surrounding the source conductive via structure 76V. In one embodiment, the continuous source structure 76 can comprise a metallic dielectric liner 76A contacting sidewalls of the array of dielectric pillars 20 and extending above a topmost surface of the alternating stack (32, 46), and a conductive fill material portion 76B surrounded by the metallic dielectric liner 76A.

A stepped surface region can be provided in the contact region 300. End portions of the electrically conductive layers 46 form stepped surfaces in the stepped surface region. The source conductive layer 76L can laterally extend farther than any of the electrically conductive layers 46. In one embodiment, the continuous source structure 76 can contact at least one of outer sidewall of each source region 61 and an annular bottom surface of the memory film 50.

In one embodiment, each dielectric pillar 20 in the array of dielectric pillars 20 can have a topmost surface located at, or underneath, a first horizontal plane including a bottommost surface of the alternating attack (32, 46), and can have a bottommost surface located at, or above, a second horizontal plane including a top surface of the substrate 10. In one embodiment, the array of dielectric pillars 20 can comprise silicon oxide. The dielectric pillars 20 which terminate below the alternating stack (32, 46) are different from the through-stack dielectric support pillars 7P which extend through the entire alternating stack (32, 46).

In one embodiment, the monolithic three-dimensional memory device comprises a vertical NAND device located over the substrate, and the electrically conductive layers 46 comprise, or are electrically connected to, a respective word line of the NAND device. In one embodiment, the substrate 10 comprises a silicon substrate, the vertical NAND device comprises an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels 60. At least one end portion of each of the plurality of semiconductor channels 60 extends substantially perpendicular to a top surface of the substrate. The array of monolithic three-dimensional NAND strings can comprise a plurality of charge storage elements. Each charge storage element can be located adjacent to a respective one of the plurality of semiconductor channels 60. The array of monolithic three-dimensional NAND strings can comprise a plurality of control gate electrodes having a strip shape extending substantially parallel to the top surface of the substrate. The plurality of control gate electrodes comprises at least a first control gate electrode located in the first device level and a second control gate electrode located in the second device level.

Figure 20:
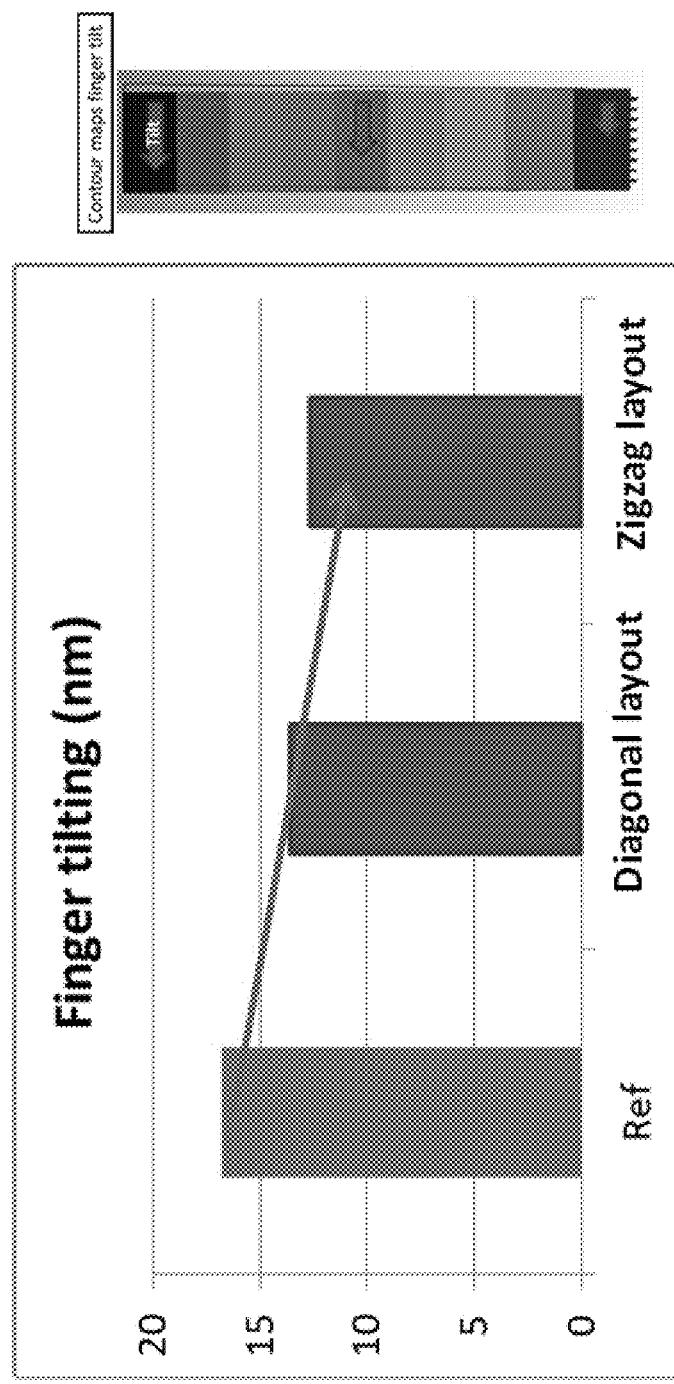
FIG. 20 is a graph illustrating magnitude of stress on memory stack structures for various configurations of dielectric pillars according to embodiments of the present disclosure.

Referring to FIG. 20, a graph illustrating magnitude of stress on memory stack structures 55 for various configurations of dielectric pillars according to embodiments of the present disclosure. The unit of the vertical axis (for the magnitude of stress) is arbitrary. The case labeled "Ref" refers to a configuration in which the array of dielectric pillars 20 is not present. The case labeled "Diagonal layout" refers to the third configuration for the array of dielectric pillars 20. The case labeled "Zigzag layout" refers to the first configuration for the array of dietetic pillars 20.

The array of dielectric pillars 20 reduces mechanical stress to provide stable structures during the manufacturing process. The simulation data of FIG. 20 was obtained with the assumption of 100 layers within the alternating stack (32, 46) employing a linear repeating boundary condition. Based on a computer simulation of finger tilting and stresses on the dielectric pillars 20 under imbalanced capillary force, the amplitude of finger tilting, or the risk of finger collapse, can be reduced by 25% with the zigzag layout.

The exemplary structure of the present disclosure employs the continuous source structure 76 as a bottom connection for the semiconductor channels 60 in the memory openings 49. The array of dielectric pillars 20 provides structural protection against mechanical stress on the memory stack structures 55 during formation of the source conductive layer 76L.

The array of dielectric pillars 20 can be employed to prevent collapse of the source line cavity 15, and to enable formation of the continuous source structure 76 that includes the source conductive layer 76L. While the presence of the dielectric pillars 20 may adversely affect the source-side contact resistance, the degradation of the source-side contact resistance is manageable at the densities illustrated in FIGS. 13A-13C.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device comprising:
    an alternating stack of electrically conductive layers and insulating layers located over a substrate;
    an array of memory stack structures, each memory stack structure extending through the alternating stack and including a memory film and a semiconductor channel laterally surrounded by the memory film;
    an array of dielectric pillars located between the alternating stack and the substrate; and
    a continuous source structure including a source conductive layer that laterally surrounds each dielectric pillar in the array of dielectric pillars, wherein the three-dimensional memory device comprises at least one feature selected from:
    a first feature that the continuous source structure comprises a metallic dielectric liner contacting sidewalls of the array of dielectric pillars and extending above a topmost surface of the alternating stack, and a conductive fill material portion surrounded by in the metallic dielectric liner;
    a second feature that the three-dimensional memory device further comprises a stepped surface region in which end portions of the electrically conductive layers form stepped surfaces, wherein the source conductive layer laterally extends farther than the electrically conductive layers; and
    a third feature that the continuous source structure contacts at least one of an outer sidewall of an annular source region and an annular bottom surface of the memory film, and the three-dimensional memory device further comprises a dielectric cam plate underlying the semiconductor channel and comprising a same set of dielectric materials as the memory film.

2. The three-dimensional memory device of claim 1, wherein:
    the source conductive layer extends horizontally between the substrate and the alternating stack parallel to the top surface of the substrate;
    the continuous source structure further includes a source conductive via structure that extends vertically through the alternating stack perpendicular to the top surface of the substrate; and
    the continuous source structure is an integral structure without an interface between the source conductive via structure and the source conductive layer.

3. The three-dimensional memory device of claim 1, wherein the array of dielectric pillars comprises silicon oxide.

4. The three-dimensional memory device of claim 1, further comprising:
    a lower source insulator layer located between the substrate and the source conductive layer;
    an upper source insulator layer located between the source conductive layer and the alternating stack; and
    an insulating spacer laterally surrounding the source conductive via structure.

5. The three-dimensional memory device of claim 1, wherein the three-dimensional memory device comprises the first feature.

6. The three-dimensional memory device of claim 1, wherein the three-dimensional memory device comprises the second feature.

7. The three-dimensional memory device of claim 1, wherein the three-dimensional memory device comprises the third feature.

8. The three-dimensional memory device of claim 1, wherein each dielectric pillar in the array of dielectric pillars has a topmost surface located at, or underneath, a first horizontal plane including a bottommost surface of the alternating stack, and has a bottommost surface located at, or above, a second horizontal plane including a top surface of the substrate.

9. The three-dimensional memory device of claim 1, wherein the array of dielectric pillars and the array of memory stack structures collectively constitute a two-dimensional periodic array of multiple instances of a unit cell structure that includes multiple memory stack structures and at least one dielectric pillar.

10. The three-dimensional memory device of claim 1, wherein the array of dielectric pillars comprises a zigzag row array, a lattice array or a diagonal line array of the dielectric pillars.

11. The three-dimensional memory device of claim 9, wherein the array of memory stack structures comprise an hexagonal array of memory stack structures, and a ratio of a total number of the multiple memory stack structures in the unit cell structure to a total number of the at least one dielectric pillar in the unit cell structure is in a range from 2 to 4.

12. The three-dimensional memory device of claim 1, wherein:
   the three-dimensional memory device comprises a vertical NAND device located over the substrate;
   the electrically conductive layers comprise, or are electrically connected to, a respective word line of the NAND device;
   the substrate comprises a silicon substrate;
   the vertical NAND device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and
   the array of monolithic three-dimensional NAND strings comprises:
      a plurality of semiconductor channels, wherein at least one end portion of each of the plurality of semiconductor channels extends substantially perpendicular to a top surface of the substrate;
      a plurality of charge storage elements, each charge storage element located adjacent to a respective one of the plurality of semiconductor channels; and
      a plurality of control gate electrodes having a strip shape extending substantially parallel to the top surface of the substrate, the plurality of control gate electrodes comprise at least a first control gate electrode located in the first device level and a second control gate electrode located in the second device level.

13. A three-dimensional memory device comprising:
   an alternating stack of electrically conductive layers and insulating layers located over a substrate;
   an array of memory stack structures, each memory stack structure extending through the alternating stack and including a memory film and a semiconductor channel laterally surrounded by the memory film; and
   an array of dielectric pillars located between the alternating stack and the substrate, wherein the array of dielectric pillars comprises a zigzag row array, a lattice array or a diagonal line array of the dielectric pillars.

14. The three-dimensional memory device of claim 13, further comprising a continuous source structure including a source conductive layer that laterally surrounds each dielectric pillar in the array of dielectric pillars.

15. The three-dimensional memory device of claim 14, wherein:
   the source conductive layer extends horizontally between the substrate and the alternating stack parallel to the top surface of the substrate;
   the continuous source structure further includes a source conductive via structure that extends vertically through the alternating stack perpendicular to the top surface of the substrate; and
   the continuous source structure is an integral structure without an interface between the source conductive via structure and the source conductive layer.

16. The three-dimensional memory device of claim 14, wherein the array of dielectric pillars comprises silicon oxide.

17. The three-dimensional memory device of claim 14, further comprising:
   a lower source insulator layer located between the substrate and the source conductive layer;
   an upper source insulator layer located between the source conductive layer and the alternating stack; and
   an insulating spacer laterally surrounding the source conductive via structure.

18. The three-dimensional memory device of claim 14, wherein the continuous source structure comprises:
   a metallic dielectric liner contacting sidewalls of the array of dielectric pillars and extending above a topmost surface of the alternating stack; and
   a conductive fill material portion surrounded by in the metallic dielectric liner.

19. The three-dimensional memory device of claim 14, further comprising a stepped surface region in which end portions of the electrically conductive layers form stepped surfaces, wherein the source conductive layer laterally extends farther than the electrically conductive layers.

20. The three-dimensional memory device of claim 14, wherein the continuous source structure contacts at least one of an outer sidewall of an annular source region and an annular bottom surface of the memory film.

21. The three-dimensional memory device of claim 20, further comprising a dielectric cap plate underlying the semiconductor channel and comprising a same set of dielectric materials as the memory film.

22. The three-dimensional memory device of claim 14, wherein each dielectric pillar in the array of dielectric pillars has a topmost surface located at, or underneath, a first horizontal plane including a bottommost surface of the alternating stack, and has a bottommost surface located at, or above, a second horizontal plane including a top surface of the substrate.

23. The three-dimensional memory device of claim 14, wherein the array of dielectric pillars and the array of memory stack structures collectively constitute a two-dimensional periodic array of multiple instances of a unit cell structure that includes multiple memory stack structures and at least one dielectric pillar.

24. The three-dimensional memory device of claim 14, wherein the array of memory stack structures comprise an hexagonal array of memory stack structures, and a ratio of a total number of the multiple memory stack structures in the unit cell structure to a total number of the at least one dielectric pillar in the unit cell structure is in a range from 2 to 4.

25. The three-dimensional memory device of claim 14, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *